United States Patent
Homma

(10) Patent No.: US 11,137,433 B2
(45) Date of Patent: Oct. 5, 2021

(54) RADIO WAVE MEASUREMENT SYSTEM

(71) Applicant: Mitsubishi Electric Corporation, Chiyoda-ku (JP)

(72) Inventor: Yukihiro Homma, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 7 days.

(21) Appl. No.: 16/615,307

(22) PCT Filed: Apr. 3, 2018

(86) PCT No.: PCT/JP2018/014265
§ 371 (c)(1),
(2) Date: Nov. 20, 2019

(87) PCT Pub. No.: WO2018/220996
PCT Pub. Date: Dec. 6, 2018

(65) Prior Publication Data
US 2020/0177029 A1 Jun. 4, 2020

(30) Foreign Application Priority Data

May 29, 2017 (JP) .............................. JP2017-105269

(51) Int. Cl.
*G01R 29/10* (2006.01)
*H02J 50/23* (2016.01)
(Continued)

(52) U.S. Cl.
CPC .............. *G01R 29/10* (2013.01); *B64C 13/20* (2013.01); *B64C 39/024* (2013.01); *B64F 3/02* (2013.01);
(Continued)

(58) Field of Classification Search
CPC ..... G01R 29/10; G01R 29/0871; G01S 13/32; B64F 3/02; H01Q 3/267; H01Q 23/00;
(Continued)

(56) References Cited

U.S. PATENT DOCUMENTS

2008/0265087 A1  10/2008  Quinn et al.
2009/0167605 A1   7/2009  Haskell
(Continued)

FOREIGN PATENT DOCUMENTS

DE   10 2011 015 917 A1   10/2012
JP          2-151104 A        6/1990
(Continued)

OTHER PUBLICATIONS

Makino, K., et al., "Development and Demonstration of the High-Precision Beam Steering Controller for Microwave Power Transmission, which takes account of applying to SSPS (Space Solar Power Systems)". Institute of Electronics, Information and Communication Engineers, IEICE Technical Report, SANE 2015-22, Jun. 2015, pp. 37-42 (with English abstract).

(Continued)

*Primary Examiner* — Jared Fureman
*Assistant Examiner* — Joel Barnett
(74) *Attorney, Agent, or Firm* — Oblon, McClelland, Maier & Neustadt, L.L.P.

(57) ABSTRACT

A radio wave measurement system includes: an aerial moving body to move or to hover above a measurement target antenna for radiating a radio wave in a sky direction; and a position measurer to measure a position of the aerial moving body. The aerial moving body is mounted with a measurement antenna to receive the radio wave and a radio wave measurer to measure received radio wave data. The radio wave measurement system further includes a radiated radio wave data generator to generate radiated radio wave data (Continued)

including the received radio wave data and the radio wave source relative position data representing measurement point data that is data of a position of the aerial moving body at a point of time when the received radio wave data is measured, as a relative position with respect to the measurement target antenna.

20 Claims, 18 Drawing Sheets

(51) Int. Cl.
| | |
|---|---|
| B64C 13/20 | (2006.01) |
| B64C 39/02 | (2006.01) |
| B64F 3/02 | (2006.01) |
| H01Q 3/26 | (2006.01) |
| H01Q 23/00 | (2006.01) |
| H02J 50/20 | (2016.01) |
| G01S 13/32 | (2006.01) |

(52) U.S. Cl.
CPC ............. *G01S 13/32* (2013.01); *H01Q 3/267* (2013.01); *H01Q 23/00* (2013.01); *H02J 50/20* (2016.02); *H02J 50/23* (2016.02); *B64C 2201/066* (2013.01)

(58) Field of Classification Search
CPC ....... B64C 13/20; B64C 39/024; B64C 27/08; B64C 39/02; B64C 2201/066; B64D 27/24; B64D 47/00; H02J 50/80; H02J 50/20; H02J 50/23; H02J 50/40
See application file for complete search history.

(56) References Cited

U.S. PATENT DOCUMENTS

| | | | | |
|---|---|---|---|---|
| 2013/0285603 | A1 | 10/2013 | Zeinstra et al. | |
| 2015/0280495 | A1 | 10/2015 | Homma et al. | |
| 2017/0081043 | A1* | 3/2017 | Jones | B64C 37/02 |
| 2017/0244270 | A1* | 8/2017 | Waters | B64C 39/024 |
| 2017/0329351 | A1* | 11/2017 | Park | G01D 11/30 |
| 2018/0074155 | A1* | 3/2018 | Onomura | G01S 19/49 |
| 2018/0229859 | A1* | 8/2018 | Evans | H02J 7/025 |

FOREIGN PATENT DOCUMENTS

| | | |
|---|---|---|
| JP | 5-302947 A | 11/1993 |
| JP | 7-321536 A | 12/1995 |
| JP | 8-37743 A | 2/1996 |
| JP | 8-130840 A | 5/1996 |
| JP | 2001-201526 A | 7/2001 |
| JP | 2007-18211 A | 1/2007 |
| JP | 2007-22382 A | 2/2007 |
| JP | 2008-211868 A | 9/2008 |
| JP | 2008-259392 A | 10/2008 |
| JP | 2009-33954 A | 2/2009 |
| JP | 2009-540646 A | 11/2009 |
| JP | 2011-142708 A | 7/2011 |
| JP | 2011-182144 A | 9/2011 |
| JP | 2013-534401 A | 9/2013 |
| JP | 2015-5906 A | 1/2015 |
| JP | 2016-127678 A | 7/2016 |
| JP | 2017-69799 A | 4/2017 |
| WO | WO 2014/054276 A1 | 4/2014 |

OTHER PUBLICATIONS

International Search Report dated Jul. 10, 2018 in PCT/JP2018/015092, 10 pages.
Japanese Office Action dated Jan. 29, 2019 in Japanese Patent Application No. 2018-555789 (with unedited computer generated English translation), 8 pages.
Japanese Office Action dated Dec. 18, 2018 in Japanese Patent Application No. 2018-204187 (with unedited computer generated English translation), 6 pages.
Japanese Office Action dated Apr. 16, 2019 in Japanese Patent Application No. 2018-204187 (with unedited computer generated English translation), 10 pages.
Japanese Office Action dated Jan. 29, 2019 in Japanese Patent Application No. 2018-557437 (with unedited computer generated English translation), 8 pages.
Japanese Office Action dated Jun. 11, 2019 in Japanese Patent Application No. 2018-209637 (with unedited computer generated English translation), 7 pages.
International Search Report dated Jul. 10, 2018 in PCT/JP2018/014265, 4 pages.
Office Action dated Jun. 16, 2020 in corresponding Korean Patent Application No. 10-2019-7034333 (with English Translation), 10 pages.
Extended European Search Report dated May 18, 2020 in Patent Application No. 18809914.7, 8 pages.
Extended European Search Report dated May 18, 2020 in Patent Application No. 18809345.4, 7 pages.
"Report ITU-R SM.2056:Airborne Verification of Antenna Patterns of Broadcasting Stations" Report ITU-R SM.2056, XP002679803, Retrieved from the Internet: URL:http://www.itu.int/dms_pub/itu-r/opb/rep/R-REP-SM. 056-2006-PDF-E.pdf [retrieved on Jul. 9, 2012], Jul. 26, 2006, pp. 1-32.
Indian Office Action dated Feb. 22, 2021 in Indian Patent Application No. 201947046828 (with English translation), 6 pages.
Office Action dated Mar. 11, 2021 in corresponding Indian Patent Application No. 201947046896 (with English Translation), 5 pages.
Extended European Search Report dated Dec. 17, 2020 in European Patent Application No. 20194783.5, 7 pages.
Office Action dated May 18, 2021, in corresponding Chinese Patent Application No. 201880033711.5 (with English translation) 14 pages.
Office Action dated Jun. 10, 2021, in corresponding Chinese Patent Application No. 201880034108.9 (with English translation) 15 pages.

\* cited by examiner

RADIO WAVE MEASUREMENT SYSTEM

TECHNICAL FIELD

The present disclosure relates to a radio wave measurement system that measures a radio wave radiated by an antenna.

BACKGROUND ART

A system in which a direction of a transmitted microwave beam for the power transmission is controlled by controlling the microwaves radiated from a plurality of element antennas has been developed (see Non Patent Literature 1). The system is developed for the purpose of the remote power transmission using the radio wave in a frequency band such as a microwave. In the system, an amplitude mono-pulse method and a rotating element electric field vector (REV) method are adopted for beam control. High-efficient wireless power transmission using microwaves is provided by adopting the amplitude mono-pulse method and the REV method. A pilot signal guiding a transmission direction of a power transmission microwave is transmitted from a power receiving side, each power transmission panel detects an arrival direction of the pilot signal using the amplitude mono-pulse method, and the microwave is radiated in the arrival direction of the pilot signal. An optical path length corresponding to a level difference between the power transmission panels is detected and corrected by the REV method. A monitor antenna is attached to a XY scanner movable in two-dimension, and an area where the radio wave is radiated is scanned with the XY scanner, thereby measuring a beam direction or a radiation pattern of the microwave with which the power is transmitted.

A technique of leading a moving body to which the power is fed in a direction in which electromagnetic field energy is increased and guiding the moving body to a feeding position where wireless feeding is performed has been proposed as a feeding system for feeding the moving body in an underwater environment (see PATENT LITERATURE 1). PATENT LITERATURE 1 proposes that an antenna for the power transmission is used also for communication. In FIG. 11 of PATENT LITERATURE 1, a communication function 150 exists in a transmission antenna 11-1. In FIG. 12, a communication function 250 exists in a reception antenna 21-1. However, a specific configuration in which the antenna for the power transmission is used also for the communication is not described in PATENT LITERATURE 1.

CITATION LIST

Patent Literature

PATENT LITERATURE 1: Japanese Patent Laid-Open No. 2016-127678

Non Patent Literature

NON PATENT LITERATURE 1: Katsumi Makino et al., "Development and Demonstration of the High-Precision Beam Steering Controller for Microwave Power Transmission, which takes account of applying to SSPS (Space solar power systems)", IEICE Technical Report, SANE 2015-22, pp. 37-42, June 2015.

SUMMARY OF INVENTION

Technical Problem

In an environment where the radio wave is reflected, there is an influence of multipath. For this reason, it is difficult to measure an antenna radiation pattern with high accuracy. In the case of measuring the antenna radiation pattern with high accuracy, the radio wave is measured in an environment of an anechoic chamber where the radio wave is hardly reflected. However, even in the environment of the anechoic chamber, the measurement is affected by multipath reduced to be very little. For this reason, sometimes the measurement cannot be performed with required accuracy. In a wireless power transmission device that transmits the power to the aerial moving body, the radio wave cannot be radiated with high accuracy in the direction in which the aerial moving body exists, and efficiency of the wireless power transmission is degraded.

In order to solve the above problems, an object of the present disclosure is to obtain a radio wave measurement system that measures a radio wave radiated by an antenna accurately using an aerial moving body such as a drone, a wireless power transmission device that controls the radio wave radiated from the antenna that transmits the power to the aerial moving body with higher accuracy than the conventional technique.

Solution to Problem

According to one aspect of the present disclosure, a radio wave measurement system includes: an aerial moving body to move or to hover above a measurement target antenna for radiating a radio wave in a sky direction; and a position measurer to measure a position of the aerial moving body. The aerial moving body is mounted with a measurement antenna to receive the radio wave and a radio wave measurer to measure received radio wave data including at least one of an amplitude and a phase of the radio wave received by the measurement antenna. The radio wave measurement system further includes a radiated radio wave data generator to generate radiated radio wave data including the received radio wave data and the radio wave source relative position data representing measurement point data as a position relative to the measurement target antenna, the measurement point data being data of a position of the aerial moving body at a point of time when the received radio wave data is measured.

Advantageous Effects of Invention

In the radio wave measurement system of the present disclosure, the radio wave radiated by the measurement target antenna can be measured with high accuracy.

DESCRIPTION OF EMBODIMENTS

First Embodiment

Figure 1:
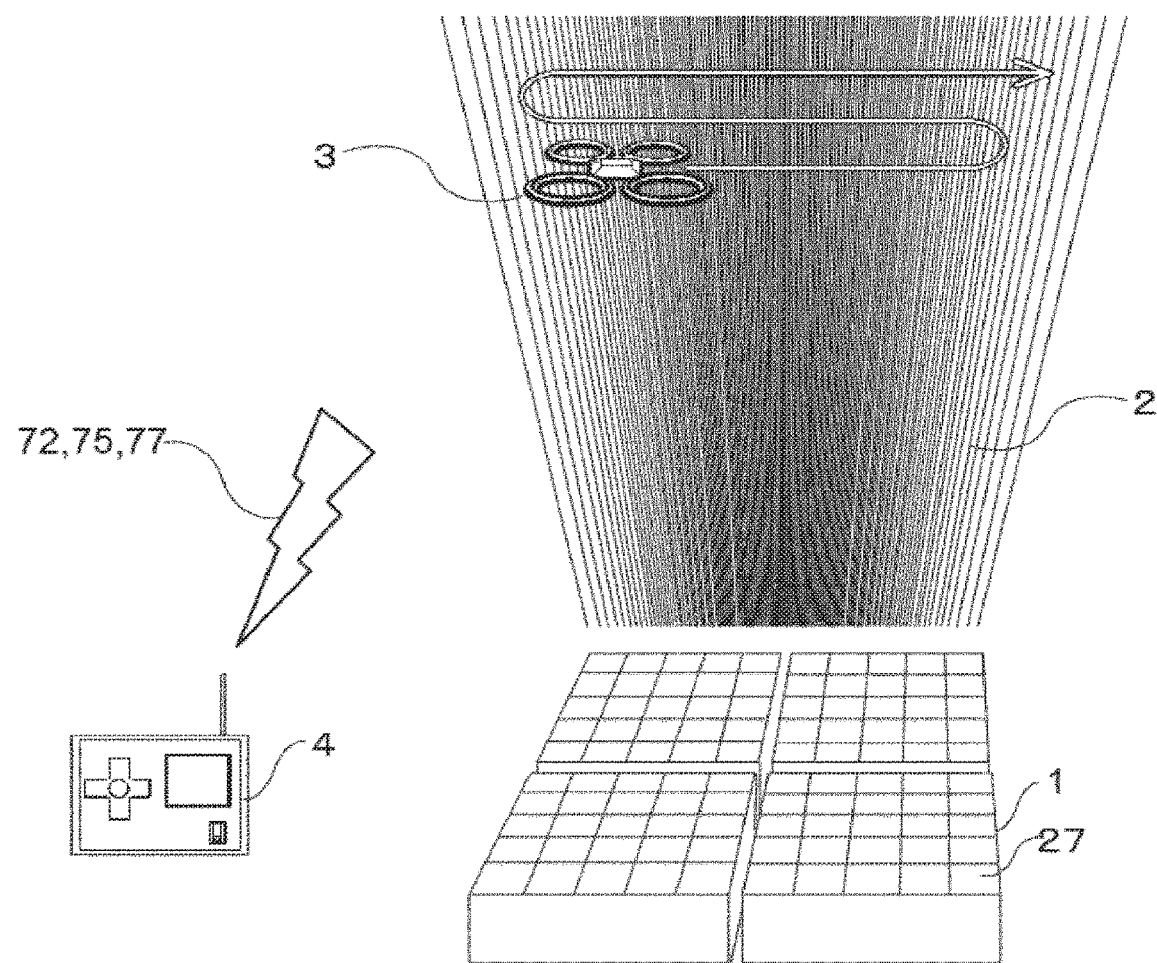
FIG. 1 is a conceptual view illustrating a radio wave measurement system using an aerial moving body according to a first embodiment of the present disclosure.
Figure 2:
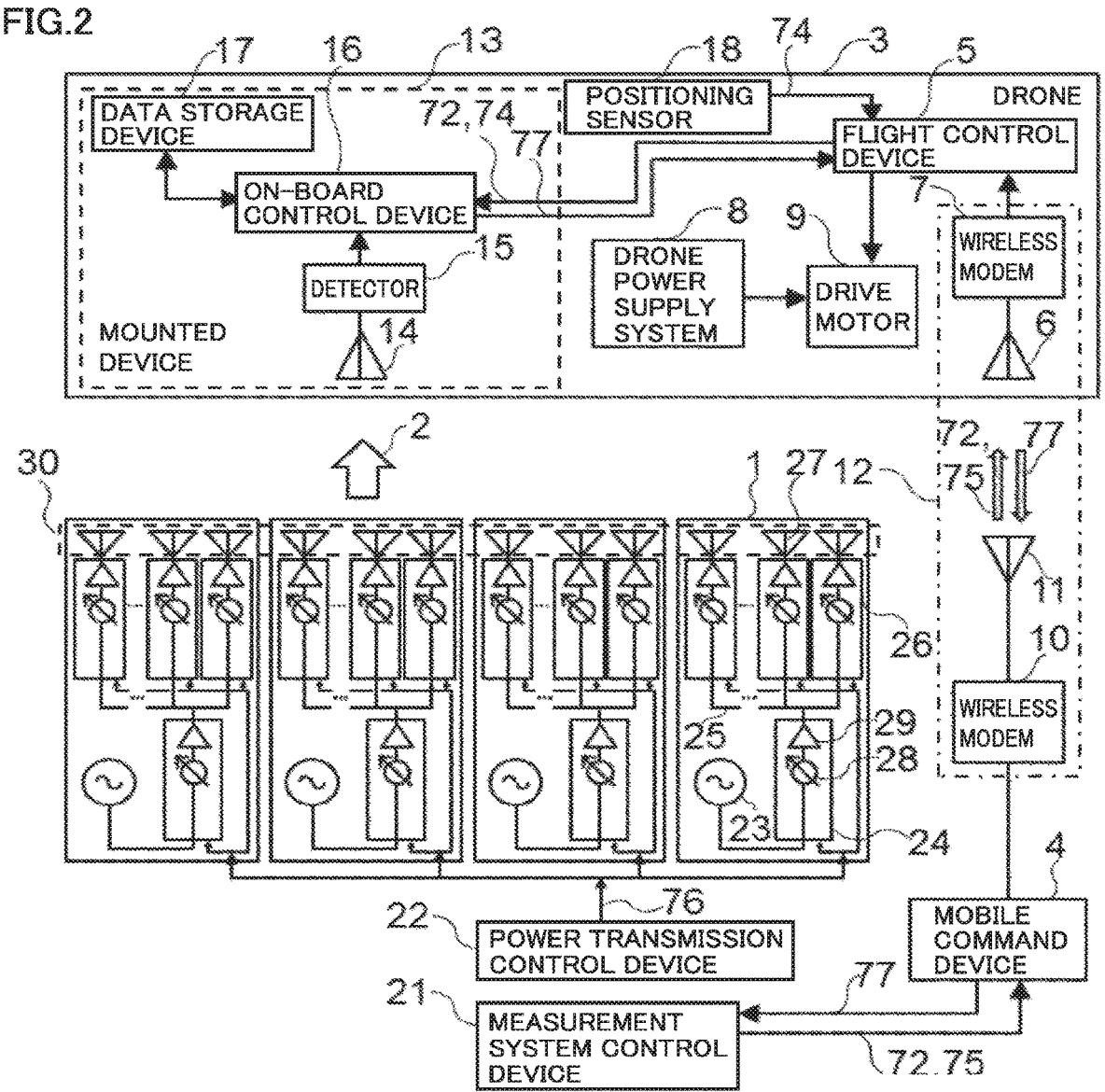
FIG. 2 is a block diagram illustrating the radio wave measurement system using the aerial moving body of the first embodiment.

With reference to FIGS. 1 and 2, a configuration of a radio wave measurement system according to a first embodiment is described. FIG. 1 is a conceptual view illustrating the radio wave measurement system using an aerial moving body according to the first embodiment of the present disclosure. FIG. 2 is a block diagram illustrating the radio wave measurement system using the aerial moving body of the first embodiment. The radio wave measurement system using the aerial moving body measures the radio wave radiated from a wireless power transmission device in a place, such as outdoors, which has a good radio wave environment.

A plurality of (in the example of FIG. 1, four) power transmission devices 1 radiate power transmission radio waves 2 outdoor in a sky direction. Power transmission device 1 is a wireless power transmission device including a power transmission antenna that transmits power by the radiated radio wave. Two-dimensional or three-dimensional strength distribution (referred to as a radiation pattern, a radio wave shape, or a beam shape) of an electric field and a magnetic field by power transmission radio wave 2 formed in a space above power transmission device 1 is measured using a drone 3. As used herein, the drone is a generic term of an unmanned aircraft that can fly (move in air) by remote control or automatic control. Drone 3 is controlled by a person or a computer through a mobile command device 4.

Drone 3 includes a flight control device 5, an on-board communication antenna 6, a wireless modem 7, and a drone power supply system 8. Flight control device 5 controls a mechanism of drone 3 in order to cause drone 3 to move or hover in air. On-board communication antenna 6 transmits and receives the radio wave for the purpose of communication. Wireless modem 7 performs communication using on-board communication antenna 6. Drone power supply system 8 manages the power to be used by drone 3 for the flight, the communication, and the measurement of the beam shape of the radio wave. A drive motor 9 being a power source is illustrated in the drawings as a representative of the mechanism that causes drone 3 to move or hover in the air. Mobile command device 4 includes a wireless modem 10 and a communication antenna 11 to communicate with drone 3. Drone 3 and mobile command device 4 usually include these devices. Wireless modem 10 and communication antenna 11 of mobile command device 4 and on-board communication antenna 6 and wireless modem 7 of drone 3 constitute a mobile communication system 12. Drone 3 is controlled by mobile communication system 12.

Drone 3 further includes a mounted device 13 that measures beam shape data 71 representing a beam shape formed by power transmission radio wave 2. Mounted device 13 includes a monitor antenna 14, a detector 15, an on-board control device 16, and a data storage device 17. Monitor antenna 14 receives power transmission radio wave 2. Monitor antenna 14 is a measurement antenna that receives the radio wave radiated by power transmission device 1. Detector 15 detects the radio wave received by monitor antenna 14, and measures a phase and an amplitude of the radio wave. On-board control device 16 controls detector 15 to manage measured detection data 73. Data storage device 17 is a storage device that stores detection data 73 and the like. The drone is mounted with the instrument and the device that are included in the mounted device and a functional unit that represents processing performed by the on-board control device.

A measurement command 72 for measuring detection data 73 with detector 15 is sent from mobile command device 4 to on-board control device 16 through mobile communication system 12 and flight control device 5. On-board control device 16 controls detector 15 according to an instruction indicated with measurement command 72.

Detection data 73 includes at least one or both of the amplitude and the phase of power transmission radio wave 2. Detection data 73 is received radio wave data including the amplitude and the phase of power transmission radio wave 2 received by monitor antenna 14. Detector 15 is a radio wave measurer that measures the received radio wave data.

On-board control device 16 and flight control device 5 are connected to each other in a wired or near-field wireless communication manner, and can send and receive the data and the command bidirectionally. Drone 3 includes a positioning sensor 18, such as a GPS (Global Positioning System) receiver. The positioning sensor 18 measures a position of drone 3. Position data 74 measured by positioning sensor 18 is sent to on-board control device 16 through flight control device 5. Measurement data 77 includes positioned detection data 70 being data in which detection data 73 is paired with position data 74 representing the position of drone 3 at a point of time when detection data 73 is measured, namely, at time the radio wave is received. Measurement data 77 is stored in data storage device 17. Position data 74 is measurement point data that is the position of drone 3 at a point of time detection data 73 is measured. Positioned detection data 70 is also referred to as radio wave measurement data. Measurement data 77 stored in data storage device 17 is inputted to a measurement system control device 21 after drone 3 is landed.

Measurement data 77 may be sent to measurement system control device 21 through mobile communication system 12. FIG. 2 also illustrates a flow of the data, such as measurement data 77. The data is sent to measurement system control device 21 through mobile communication system 12.

Mobile command device 4 sends measurement command 72 and a flight command 75 toward drone 3 through mobile communication system 12. Measurement command 72 is a command controlling mounted device 13. Flight command 75 is a command controlling the flight of drone 3. As used herein, the command is a command instructing how the instrument operates. The instrument or its control device that receives the command generates a control signal from the command, and controls the instrument with the control signal.

Figure 3:
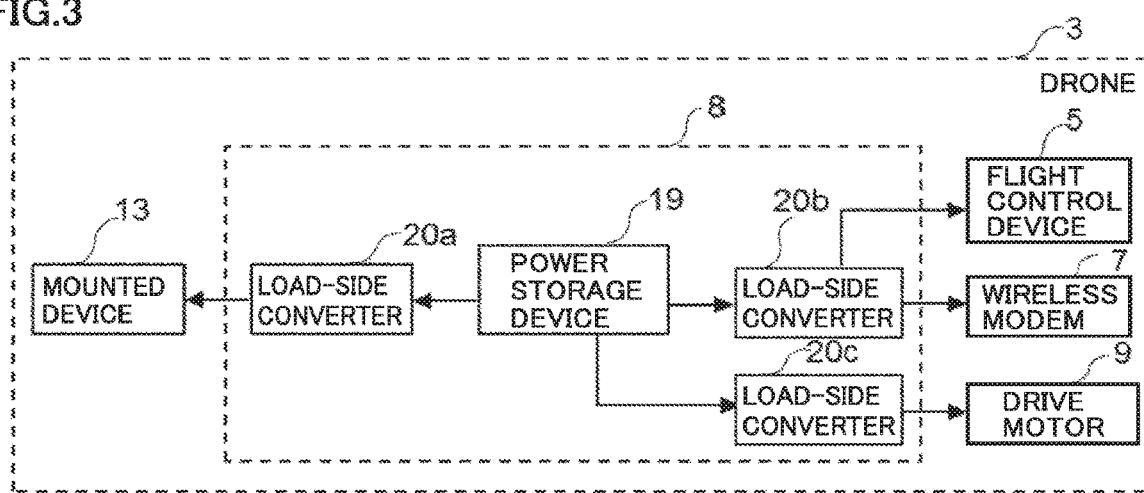
FIG. 3 is a block diagram illustrating a configuration of a power supply system of the aerial moving body constituting the radio wave measurement system of the first embodiment.

With reference to FIG. 3, the configuration of drone power supply system 8 is described. FIG. 3 is a block diagram illustrating a configuration of a power supply system of the aerial moving body constituting the radio wave measurement system of the first embodiment. Drone power supply system 8 includes a power storage device 19 and load-side converters 20a, 20b, 20c. Power storage device 19 stores DC power supplied from the outside. Load-side converters 20a, 20b, 20c are a DC-DC converter that converts the DC power stored in power storage device 19 into DC power having voltage required by load equipment, and supplies the DC power having converted voltage to the load equipment. As used herein, the load equipment means mounted device 13, flight control device 5, wireless modem 7, drive motor 9, and the like. Load-side converter 20a supplies the converted DC power to mounted device 13. Load-side converter 20b supplies the converted DC power to flight control device 5 and wireless modem 7. Load-side converter 20c supplies the power to drive motor 9. When the instrument included in mounted device 13 requires a plurality of power supply voltages, a plurality of load-side converters are provided in each voltage. When flight control device 5 and wireless modem 7 require different power supply voltages, different load-side converters supply the power to flight control device 5 and wireless modem 7. For example, when mounted device 13 and wireless modem 7 are used at the same power supply voltage, the same load-side converter may supply the power to mounted device 13 and wireless modem 7. A plurality of drive motors 9 and a plurality of load-side converters 20c may be provided in order to reduce a probability that drone 3 cannot fly.

The radio wave measurement system that measures power transmission radio wave 2 radiated by power transmission device 1 includes drone 3 on which mounted device 13 is mounted, mobile command device 4 that controls drone 3, and measurement system control device 21 that controls the radio wave measurement instrument included in mounted device 13.

Power transmission device 1 includes a transmission signal generator 23, one first-stage module 24, a distribution circuit 25, a plurality of second-stage modules 26, and an element antenna 27 provided in each second-stage module 26. Power transmission control device 22 sends a power transmission control signal 76 to power transmission device 1. Power transmission control signal 76 controls whether power transmission device 1 transmits the power, what kind of the beam shape and which one of the directions the power is transmitted, and the like. Transmission signal generator 23 generates a transmission signal of a determined frequency to be radiated as the radio wave by each element antenna 27. The transmission signal outputted from transmission signal generator 23 is inputted to first-stage module 24. The transmission signal in which amplification and the phase are adjusted by first-stage module 24 is distributed by distribution circuit 25, and inputted to second-stage module 26. The transmission signal in which the amplification and the phase are adjusted by second-stage module 26 is radiated from element antenna 27 into space as power transmission radio wave 2. The transmission signal generator 23, the first-stage module 24, and the second-stage module 26 are controlled using power transmission control signal 76. The first-stage module 24 or the second-stage module 26 is referred to as an element module.

The first-stage module 24 and the second-stage module 26 have the same configuration. Each of the first-stage module 24 and the second-stage module 26 includes a phase shifter 28 and an amplifier 29. Phase shifter 28 changes the phase of the transmission signal by a command value. Phase shifter 28 changes the phase discretely with a pitch width of phase rotation determined by a number of bits determining resolution of the phase. For example, for a 5-bit phase shifter, the phase is rotated with the pitch width of $360°/2^5=11.25°$. Phase shifter 28 may change the phase continuously. Phase shifter 28 of first-stage module 24 can change the phases of the plurality of element antennas 27 included in power transmission device 1 uniformly. Amplifier 29 amplifies the transmission signal.

In one power transmission device 1, element antennas 27 are arranged into a matrix form. Four power transmission devices 1 are arranged into the matrix form so as to be adjacent to each other. Thus, all element antennas 27 are arranged in the matrix form.

One power transmission device 1 is a phased array antenna including the plurality of element antennas 27 that can control the phase of the radiated radio wave. A set of four power transmission devices 1 can be considered as one phased array antenna 30. In the radio wave measurement system of the first embodiment, the beam shape of the radio wave radiated by phased array antenna 30 is measured. That is, phased array antenna 30 is a measurement target antenna whose beam shape is to be measured. One power transmission device 1 can be considered as a power transmitter, and an assembly of a plurality of power transmission devices 1 can be considered as a power transmission device. Power transmission device 1 corresponds to one group when the plurality of element antennas 27 are divided into a plurality of groups.

Figure 4:
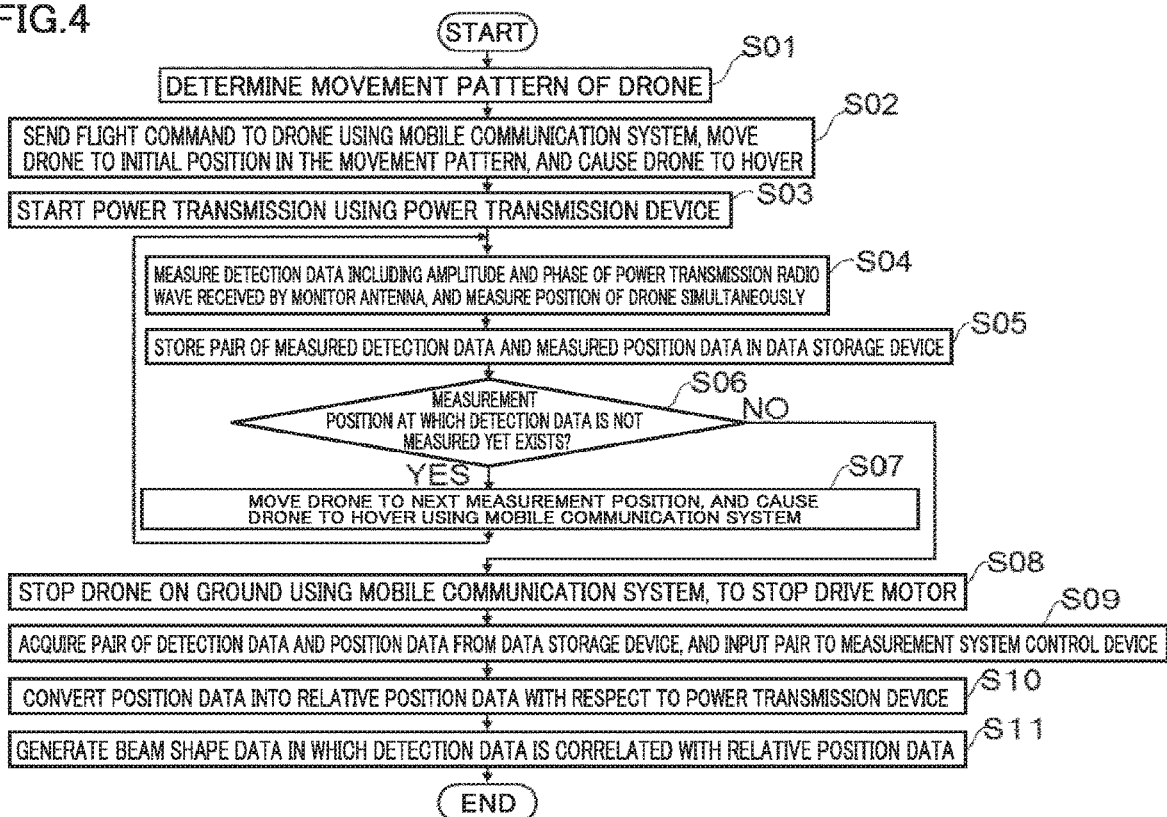
FIG. 4 is a flowchart illustrating a procedure for measuring a radiation pattern of a radio wave in the radio wave measurement system using the aerial moving body of the first embodiment.

The operation is described. FIG. 4 is a flowchart illustrating a procedure for measuring a radiation pattern of the radio wave in the radio wave measurement system using the aerial moving body of the first embodiment. In step S01, a movement pattern of drone 3 is determined. It is assumed that the movement pattern is a pattern in which two-dimensional scan is performed on a cut surface perpendicular to the direction in which power transmission radio wave 2 is radiated. The radio wave is measured three-dimensionally by setting the cut surfaces at a plurality of positions having different distances from power transmission device 1.

In step S02, mobile communication system 12 sends flight command 75 to drone 3, and drone 3 is moved to an initial position in the movement pattern and caused to hover. In step S03, power transmission device 1 starts the power transmission. Steps S02 and S03 may be exchanged.

In step S04, detection data 73 including the amplitude and the phase of power transmission radio wave 2 received by monitor antenna 14 is measured according to measurement command 72 sent by mobile communication system 12. At the same time, positioning sensor 18 measures the position of drone 3. In step S05, positioned detection data 70 that is the pair of measured detection data 73 and measured position data 74 is stored in data storage device 17. In step S06, whether the measurement position at which detection data 73 is not measured yet exists is checked. When the measurement position at which detection data 73 is not measured yet exists (YES in S06), flight command 75 is sent to drone 3 by mobile communication system 12 to cause drone 3 to move and hover to the next measurement position in step S07. The processing returns to step S04.

When the measurement position at which detection data 73 is not measured yet does not exist (NO in S06), drone 3 is landed on the ground. Specifically, in step S08, flight command 75 is sent to drone 3 by mobile communication system 12, drone 3 is stopped on the ground, and drive motor 9 is stopped. In step S09, positioned detection data 70 is acquired from data storage device 17, and inputted to measurement system control device 21. Measurement system control device 21 converts position data 74 into relative position data 78 with respect to power transmission device 1 in step S10. In step S11, beam shape data 71 in which detection data 73 is correlated with relative position data 78 is generated. The operation of drone 3 in the flowchart of FIG. 4 is performed using the power stored in power storage device 19. The ground includes not only the ground but also structures, such as a building and a tower, installed on the ground.

Drone 3 scans the cut surface two-dimensionally, so that the two-dimensional radiation pattern (beam shape) of power transmission radio wave 2 can be measured accurately. Drone 3 measures power transmission radio wave 2 while changing a height in the vertical direction. This allows the measurement of the three-dimensional radiation pattern of power transmission radio wave 2.

Position data 74 converted into the relative position with respect to power transmission device 1 is referred to as relative position data 78. Relative position data 78 is radio wave source relative position data representing position data 74 as the position relative to power transmission device 1. Beam shape data 71 is the radiated radio wave data including detection data 73 and radio wave source relative position data. Measurement system control device 21 is a radiated radio wave data generator that generates the radiated radio wave data. Measurement system control device 21 may be considered to include the radiated radio wave data generator. When another device is the radiated radio wave data generator, another device may be considered to include the radiated radio wave data generator.

The position of power transmission device 1 in the coordinate system, such as latitude, longitude, and altitude, is measured in advance by positioning sensor 18 and stored to calculate the position of drone 3 relative to power transmission device 1. The relative position data 78 is generated by subtracting the stored position of power transmission device 1 from position data 74 of drone 3. A positioning sensor may be provided also in power transmission device 1, and the relative position may be calculated by subtracting the measurement value of the positioning sensor.

The position of the power transmission device may be stored in the on-board control device, the data storage device, or another processing device, and the on-board control device or another processing device may convert the position data into relative position data. The on-board control device or another processing device may produce the radiated radio wave data including the detection data and the relative position data. In this case, the on-board control device or another processing device constitutes the radiated radio wave data generator. The case that the on-board control device produces the radiated radio wave data is described as follows. The previously-measured position of power transmission device 1 is stored in storage device of drone 3. The on-board control device converts position data 74 into relative position data 78, and generates beam shape data 71A in which detection data 73 is correlated with relative position data 78. Beam shape data 71A is also positioned detection data 70A in which detection data 73 and the relative position data 78 at the same time are combined. Positioned detection data 70A is also referred to as radio wave measurement data.

In the radio wave measurement system, power transmission radio wave 2 is radiated from power transmission device 1 to the sky. The radio wave measurement system measures beam shape data 71 of power transmission radio wave 2 above power transmission device 1 using drone 3 that is the aerial moving body. Consequently, beam shape data 71 of power transmission radio wave 2 of power transmission device 1 can be measured accurately while an influence of reflection is reduced.

In FIG. 4, detection data 73 is measured while drone 3 is caused to hover. Alternatively, detection data 73 may be measured while drone 3 is moved. Flight command 75 is sent from mobile command device 4 to control how drone 3 is caused to fly or hover. Alternatively, drone 3 may operate according to a program stored in drone 3 to fly or hover autonomously. The program stored in drone 3 is a program to cause drone 3 to fly and hover on a determined flight route.

Figure 5:
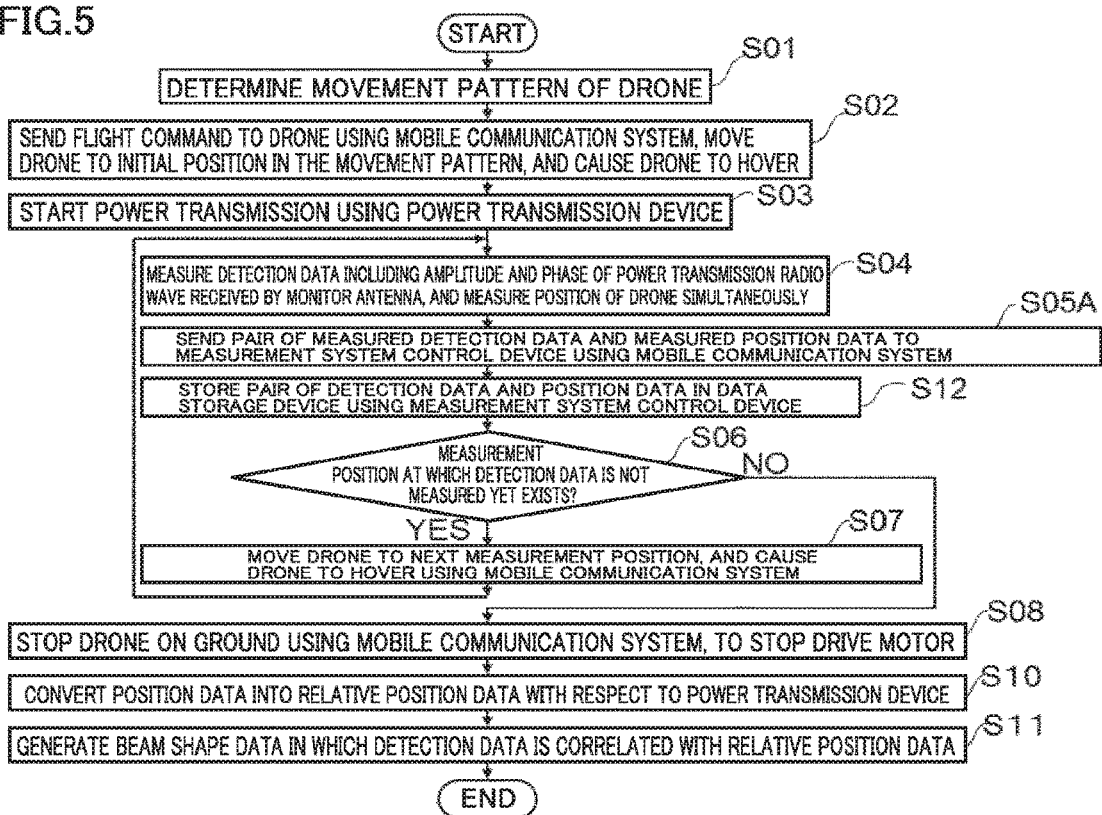
FIG. 5 is a flowchart illustrating another procedure for measuring the radiation pattern of the radio wave in the radio wave measurement system using the aerial moving body of the first embodiment.

Measurement data 77 including positioned detection data 70 may be sent to measurement system control device 21 by communication while drone 3 flies. FIG. 5 illustrates a flowchart illustrating a procedure in this case.

With reference to FIG. 5, points different from FIG. 4 are described. In step S05A, measurement data 77 including the positioned detection data 70 is sent from on-board control device 16 to flight control device 5. Measurement data 77 is transmitted to measurement system control device 21 through mobile communication system 12 and mobile command device 4. In step S12, measurement system control device 21 stores positioned detection data 70 included in measurement data 77 in the non-volatile storage device of measurement system control device 21. Because of the existence of steps S05A and S12, step S09 of acquiring positioned detection data 70 from data storage device 17 of drone 3 is deleted from the flowchart. For this reason, the processing proceeds to step S10 after step S08 is performed.

Moreover, in the procedure shown in FIG. 5, beam shape data 71 of power transmission device 1 can be measured accurately.

Detection data 73 is sent from drone 3 instead of positioned detection data 70, and measurement system control device 21 may combine position data 74 of drone 3 measured from the ground and detection data 73 to generate positioned detection data 70. Drone 3 may send at least detection data 73 to measurement system control device 21.

The radio wave measurement system can measure the beam shape of the radio wave radiated from not only the wireless power transmission device, but also an antenna for another application. The wireless power transmission device may be different from the one illustrated in the description. When the beam shape of the radio wave radiated from another wireless power transmission device or the antenna for another application is measured, the measurement target antenna means the antenna in which the beam shape is measured and the radio wave is radiated in a sky direction from the measurement target antenna. The aerial moving body such as the drone is caused to hover and move above the measurement target antenna that radiates the radio wave. The position of the aerial moving body is measured by a position measurer that is a positioning sensor such as a GPS. The aerial moving body is equipped with a measurement antenna that receives the radio wave and a detector that measures the received radio wave data including the amplitude and the phase of the radio wave received by the measurement antenna. The beam shape data is generated from the received radio wave data and measurement point data that is the position of the aerial moving body at the point of time when the received radio wave data is measured. In the beam shape data, the measurement point data is expressed as the position relative to the measurement target antenna.

Instead of the use of drone 3, a monitor antenna may be fixed at a predetermined position above power transmission device 1. However, because the radio wave is reflected or shielded by a structural member fixing the monitor antenna, there is a possibility of degrading the accuracy of the phase and the amplitude of the measured radio wave.

By performing the radio wave measurement in a place, such as the outdoors, where a radio wave environment is good, the beam shape of the measurement target antenna can be measured without being affected by multipath such as reflection on the ground. The term "not affected" means that the influence is sufficiently small. Moreover, a mobile communication system provided for controlling the drone is used for the purpose of the transmission of various data and commands. For this reason, it is not necessary to add new hardware to the drone for the purpose of the communication required to perform the beam shape measurement or the wireless power transmission. Consequently, a weight of the mounted device can be reduced, and the radio wave can be measured with low power consumption.

Measurement system control device 21, power transmission control device 22, on-board control device 16, and flight control device 5 are implemented by executing a dedicated program on a general-purpose computer or a dedicated computer. The general-purpose computer or the dedicated computer includes a memory and an arithmetic processor, such as a CPU (Central Processing Unit) that executes the program. The memory is a volatile or non-volatile memory and/or a hard disk. The memory stores the program operated by any one of measurement system control device 21, power transmission control device 22, on-board control device 16, and flight control device 5. The memory also stores data in the course of the processing and/or data of a processing result. The memory of on-board control device 16 may be shared with data storage device 17. Measurement system control device 21 and power transmission control device 22 may be constructed with one computer. On-board control device 16 and flight control device 5 may be constructed with one computer.

The above can be applied to other embodiments.

Second Embodiment

Figure 6:
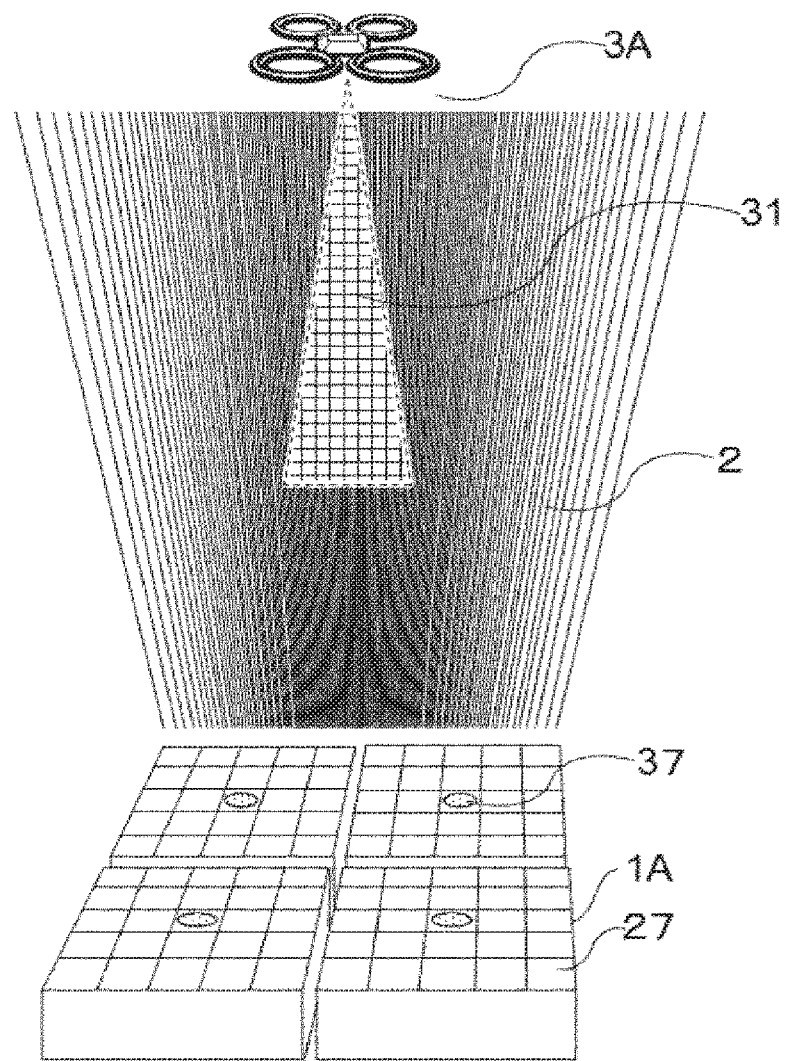
FIG. 6 is a conceptual diagram illustrating a power transmission system to an aerial moving body by a wireless power transmission device according to a second embodiment of the present disclosure.
Figure 7:
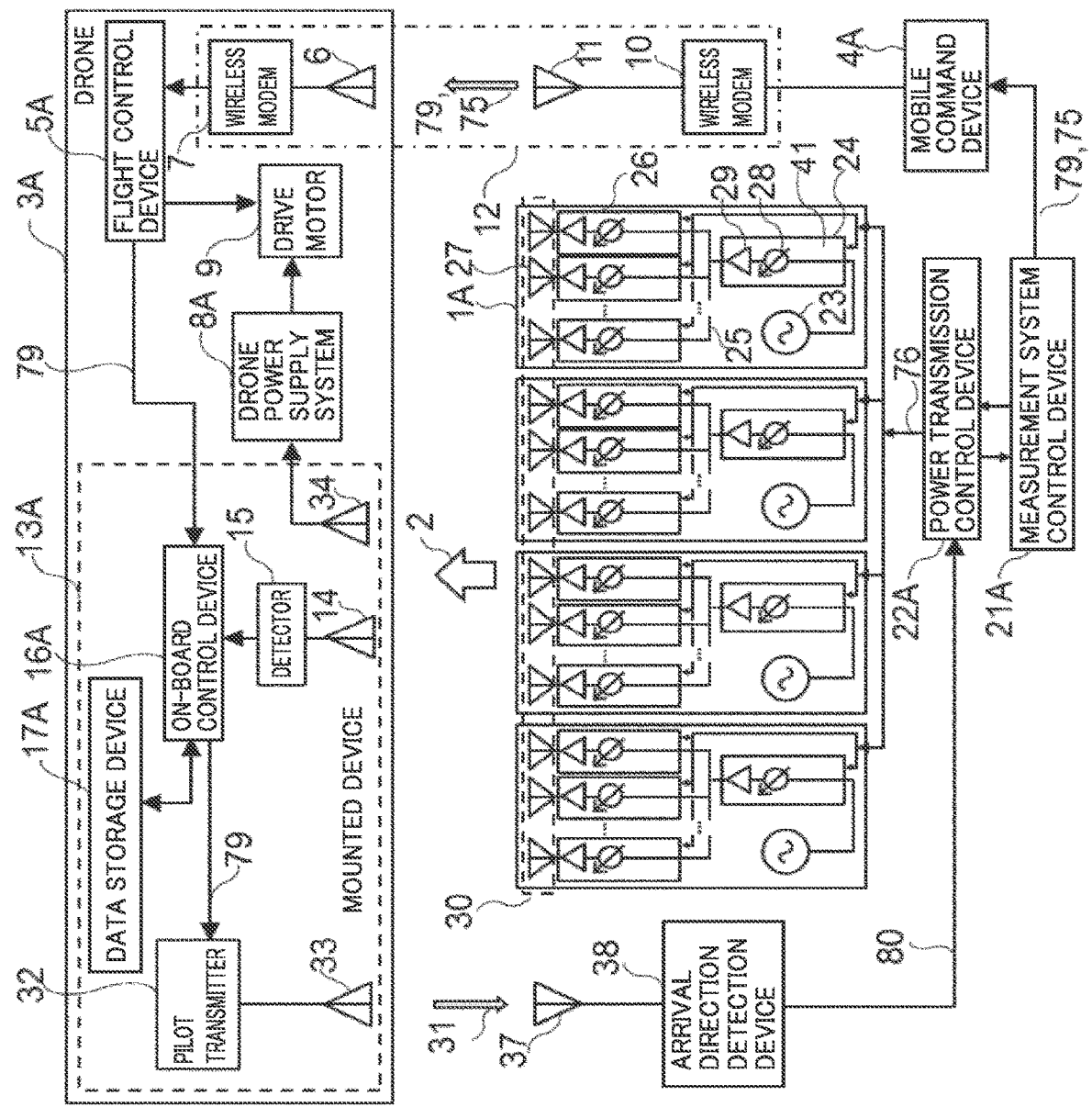
FIG. 7 is a block diagram illustrating the power transmission system to the aerial moving body by the wireless power transmission device of the second embodiment.

With reference to FIGS. 6 and 7, a configuration of a power transmission system to an aerial moving body by a wireless power transmission device according to a second embodiment is described. FIG. 6 is a conceptual diagram illustrating the power transmission system to the aerial moving body by the wireless power transmission device of the second embodiment of the present disclosure. FIG. 7 is a block diagram illustrating the power transmission system to the aerial moving body by the wireless power transmission device of the second embodiment.

In FIGS. 6 and 7, points different from FIGS. 1 and 2 are described. A drone 3A includes a pilot transmitter 32, a pilot transmission antenna 33, one or a plurality of power reception antennas 34 that receives power transmission radio wave 2, and a drone power supply system 8A. Pilot transmitter 32 generates a pilot signal 31 indicating a power transmission direction to a power transmission device 1A. Pilot transmission antenna 33 radiates pilot signal 31 toward power transmission device 1A. Drone power supply system 8A stores and uses the power that is obtained from the radio wave received by power reception antenna 34.

Drone 3A, namely, a flight control device 5A and a mobile command device 4A do not send measurement data 77 to a measurement system control device 21A. In FIG. 7, drone 3A includes monitor antenna 14 and detector 15. Alternatively, drone 3A may not include monitor antenna 14 and detector 15. Unlike data storage device 17 of the first embodiment, a data storage device 17A stores data relating to the pilot transmitter and the like, but does not store data necessary for the radio wave measurement system.

As in the first embodiment, monitor antenna 14 may receive power transmission radio wave 2, and detector 15 may measure the phase or the amplitude of the radio wave. When the radio wave is measured by monitor antenna 14 and detector 15, the power transmission system to the aerial moving body in the second embodiment may be recognized also as the radio wave measurement system. The data storage device and the on-board control device of the drone also have the same configuration as that of the first embodiment when the data storage device and the on-board control device constitute the radio wave measurement system.

Pilot transmitter 32 is controlled by measurement system control device 21A in response to a pilot transmitter control command 79. Pilot transmitter control command 79 is sent from measurement system control device 21A to on-board control device 16A through mobile command device 4 and mobile communication system 12.

In order to send pilot transmitter control command 79, measurement system control device 21A and a power transmission control device 22A can communicate with each other and send and receive data to perform a Rotating Element Electric Field Vector (REV) method before start of the power transmission. Although the reference numeral is not illustrated in FIG. 7, a command to perform the REV method is sent from power transmission control device 22A to on-board control device 16A through measurement system control device 21A. The measured data of the received power is sent from on-board control device 16A to power transmission control device 22A. Power transmission control device 22A and on-board control device 16A may communicate with each other with no use of measurement system control device 21A.

Figure 8:
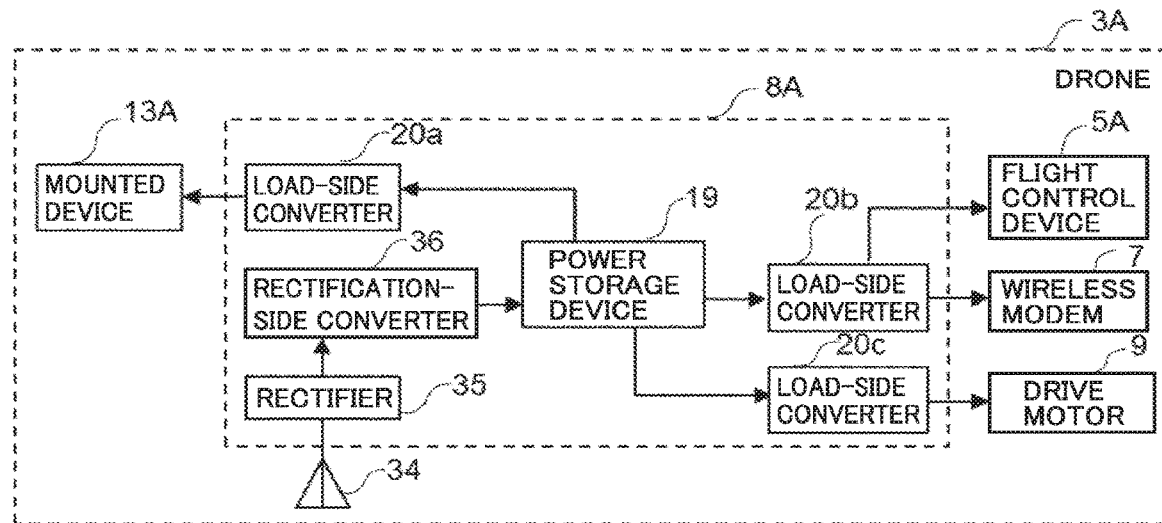
FIG. 8 is a block diagram illustrating a configuration of a power supply system of the aerial moving body that receives power transmitted from the wireless power transmission device of the second embodiment.

With reference to FIG. 8, the configuration of drone power supply system 8A is described. FIG. 8 is a block diagram illustrating the configuration of the power supply system of the aerial moving body that receives the power transmitted from the wireless power transmission device of the second embodiment. As compared to FIG. 3, drone power supply system 8A in FIG. 8 includes a rectifier 35 and a rectification-side converter 36 additionally. Rectifier 35 rectifies the received signal generated from the radio wave received by power reception antenna 34 into a direct current. The rectification-side converter 36 changes the voltage of the DC power rectified by rectifier 35. Power storage device 19 stores the DC power outputted from the rectification-side converter 36.

Power reception antenna 34, rectifier 35, and rectification-side converter 36 are added in drone power supply system 8A of the second embodiment. Consequently, the power received by power reception antenna 34 during the flight can be used in addition to the power stored in power storage device 19 before the start of the flight. For this reason, the time for which drone 3A moves or hovers in the air can be lengthened as compared to drone 3. For example, when drone 3A is used for the radio wave measurement, the time for which the radio wave is measured can further be lengthened. For example, spatial density of the measurement point in beam shape data 71 of power transmission radio wave 2 can be improved by lengthening the time.

The drone may include a plurality of power storage devices, and the power received by power reception antenna 34 during the flight may be stored in some of the power storage devices. At least one of the drone and the detector may use the power of the power storage device in which the power received during the flight is stored.

Power transmission device 1A includes a pilot reception antenna 37 that receives pilot signal 31. For example, as illustrated in FIG. 6, pilot reception antenna 37 is disposed in a central portion of element antennas 27 disposed in a matrix form in power transmission device 1A. An arrival direction detection device 38 is added. Arrival direction detection device 38 receives pilot signal 31 received by pilot reception antenna 37 of each of the plurality of power transmission devices 1A, and determines an arrival direction of pilot signal 31 by, for example, a mono-pulse method. The arrival direction is a direction in which pilot signal 31 arrives when viewed from power transmission device 1A. Arrival direction data 80 detected by arrival direction detection device 38 is inputted to power transmission control device 22A. Power transmission control device 22A controls power transmission device 1A such that power transmission radio wave 2 is radiated in the direction toward the arrival direction indicated by arrival direction data 80. That is, the radiation direction in which power transmission radio wave 2 is radiated is a direction obtained by reversing the arrival direction by 180 degrees.

Pilot signal 31 is a direction signal that is emitted by drone 3A in order to inform power transmission device 1A of the arrival direction or an existence direction. The existence direction is a direction in which drone 3A exists when viewed from power transmission device 1A. The existence direction and the arrival direction are opposite to each other. Pilot transmitter 32 and pilot transmission antenna 33 that are mounted on drone 3A are a direction signal transmitter that transmits the direction signal. Pilot reception antenna 37 of power transmission device 1A installed on the ground is a direction signal receiver that receives the direction signal. Pilot transmitter 32, pilot transmission antenna 33, and pilot reception antenna 37 are a direction signal transmission reception system that transmits and receives the direction signal.

In the second embodiment, phased array antenna 30 functions as a power transmission antenna that can change an orientation direction in which the power is transmitted by the radio wave to be radiated. Drone 3A is an aerial moving body for a power transmission target. Arrival direction detection device 38 is a radiation direction determiner that determines the radiation direction that is the direction in which drone 3A exists when viewed from power transmission device 1A. Power transmission control device 22A is an orientation direction changer that directs the orientation direction of phased array antenna 30 toward the radiation direction.

Figure 9:
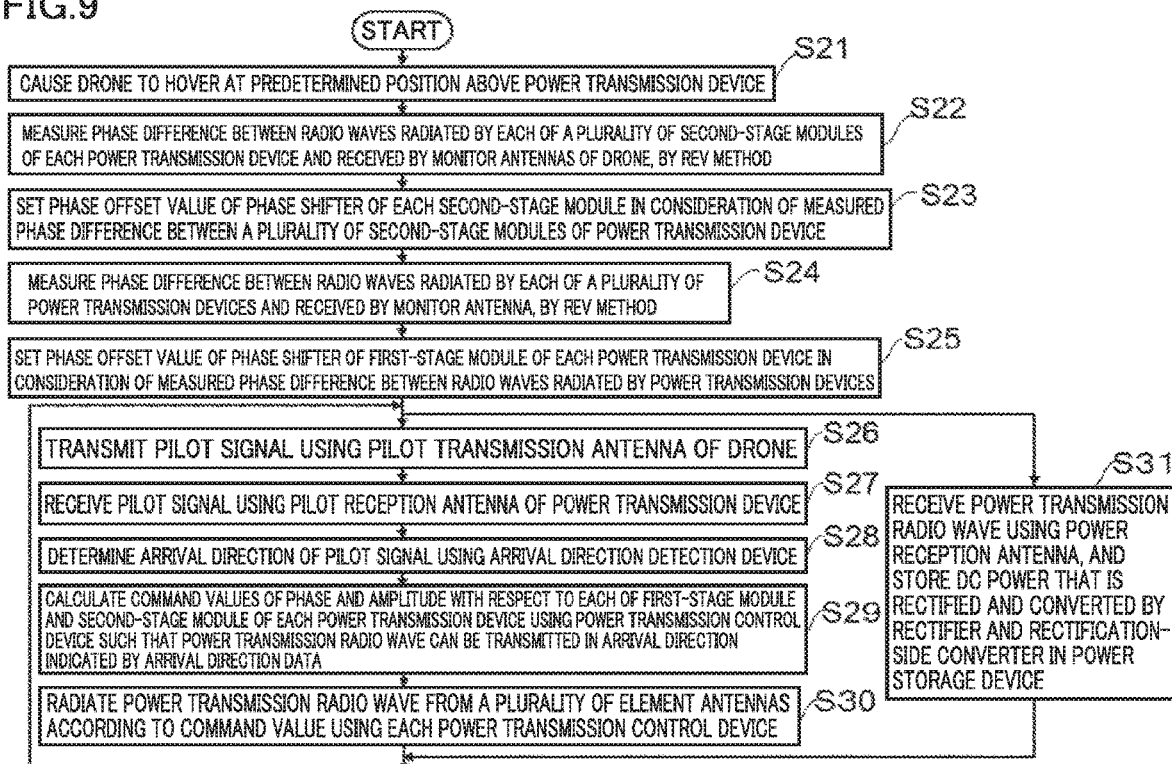
FIG. 9 is a flowchart illustrating a power transmission procedure in the power transmission system to the aerial moving body by the wireless power transmission device of the second embodiment.

The operation is described. FIG. 9 is a flowchart illustrating a power transmission procedure in the power transmission system to the aerial moving body by the wireless power transmission device of the second embodiment. In step S21, drone 3A is caused to hover at a predetermined position above power transmission device 1A.

In step S22, element antenna 27 corresponding to each of the plurality of second-stage modules 26 radiates the radio wave in each power transmission device 1A. The radio wave radiated by element antenna 27 is received by monitor antenna 14 of drone 3A. A phase difference between element electric field vectors generated at the positions of the monitor antennas 14 by the radio waves radiated by element antennas 27 is measured by the REV method. In the REV method, the phase of the radio wave radiated by one of second-stage modules 26 is changed to measure the change in the amplitude (electric field strength) of the electric field vector of the radio wave received by monitor antenna 14. Detection data 73 being the measured electric field strength is sent to power transmission control device 22 through mobile communication system 12 and measurement system control device 21. Power transmission control device 22 calculates the phase difference between the element electric field vector of the radio wave radiated by element antenna 27 corresponding to each second-stage module 26 and the electric field vector of the radio wave in which the radio waves radiated by all element antennas 27 are combined, from the change in the amplitude of the electric field vector sent by received detection data 73. The phase difference between the element electric field vectors generated by element antennas 27 is generated by a difference in path length inside power transmission device 1A, a difference in distance between each element antenna 27 and the monitor antenna 14, and the like.

In step S23, a phase offset value is set to phase shifter 28 included in each second-stage module 26 in consideration of the measured phase difference between multiple second-stage modules 26 included in each power transmission device 1A. The phase offset value is a value that is subtracted from a phase command value supplied externally. Phase shifter 28 changes the phase by an amount obtained by subtracting the phase offset value from the phase command value. Thus, the amount of change in phase of the transmission signal outputted by phase shifter 28 actually is a value obtained by subtracting the phase offset value from the phase command value. When the same phase command value is given to each second-stage module 26, each second-stage module 26 can radiate the radio wave having the same phase by subtracting the phase offset value from the phase command value.

In step S24, the phase difference between the electric field vectors radiated by each of the plurality of power transmission devices 1A and received and generated by the monitor antenna 14 is measured by the REV method while the phase of the first-stage module 24 of each power transmission device 1A is changed. The phase difference between the electric field vectors generated by power transmission devices 1A due to the difference in the path length to first-stage module 24 of each power transmission device 1A or the difference in the distance from each power transmission device 1A to monitor antenna 14 is measured in the REV method. In step S25, the phase offset value of phase shifter 28 included in first-stage module 24 of each power transmission device 1A is set in consideration of the measured phase difference between the radio waves radiated by power transmission devices 1A.

In the pieces of processing in S21 to S25, the phase offset value due to the difference in the path length inside each power transmission device 1A is measured in advance in each first-stage module 24 or second-stage module 26, and the phase command value of each phase shifter 28 is determined in consideration of the previously-measured phase offset value. For this reason, the radio wave radiated from each element antenna 27 can be set to the value in which the phase reference is matched. The pieces of processing in S21 to S25 are performed before power transmission device 1A is used for the first time. When the element module that is first-stage module 24 or second-stage module 26 is replaced, the phase offset value of the replaced element module is obtained.

In step S26, pilot transmission antenna 33 of drone 3A transmits pilot signal 31. In step S27, pilot reception antenna 37 of power transmission device 1A receives pilot signal 31. In step S28, arrival direction detection device 38 determines arrival direction data 80 of pilot signal 31. In step S29, power transmission control device 22A calculates the command values of the phase and amplitude for each of the element modules of power transmission device 1A such that power transmission radio wave 2 can be transmitted while the direction toward which the arrival direction indicated by arrival direction data 80 is set to the radiation direction. Power transmission control signal 76 is the command values of the phase and amplitude for each element module. Element antenna 27 of each second-stage module 26 radiates the radio wave having the adjusted phase. This allows the radio wave radiated in the radiation direction to be strengthened. The beam shape can be made more desirable by adjusting the amplitude of the radio wave radiated by each element antenna 27. Consequently, power transmission device 1A can efficiently transmit the power in the radiation direction.

In step S30, first-stage module 24 and each second-stage module 26 of each power transmission device 1A generate the transmission signals in which the phases and amplitudes are adjusted according to power transmission control signal 76, and radiate the transmission signals from corresponding element antennas 27 as power transmission radio wave 2.

In parallel to steps S26 to S30, in step S31, power transmission radio wave 2 is received by power reception antenna 34 of drone 3A, and the DC power rectified and converted by rectifier 35 and rectification-side converter 36 is stored in power storage device 19.

The pieces of processing in S26 to S30 and S31 are performed periodically in a determined period. After performing steps S30 and S31, the processing returns before S26 and S31. A length of one period is determined such that the difference between the previously-calculated arrival direction and the current arrival direction falls within an acceptable range when drone 3 moves at the assumed maximum movement speed.

Drone 3A transmits pilot signal 31, and power transmission device 1A radiates power transmission radio wave 2 in the direction in which pilot signal 31 arrives, so that power reception antenna 34 of drone 3A can efficiently receive power transmission radio wave 2.

Whether the beam shape formed actually by power transmission radio wave 2 radiated in step S30 of FIG. 9 becomes the assumed beam shape can be verified. For this reason, the beam shape of the radio wave beam that is radiated while the phase command value and the amplitude command value for each element antenna 27 are fixed can be measured using, for example, the radio wave measurement system in FIGS. 1 and 2. In this case, the power transmission system to the aerial moving body by the wireless power transmission device of the second embodiment is also a radio wave measurement system using the aerial moving body.

As a radio wave measurement system, instead of using the drone 3A, the monitor antenna may be fixed at a predetermined position above the power transmission device 1A. However, because the radio wave is reflected or shielded by a structural member fixing the monitor antenna, there is a possibility of degrading the accuracy of the phase and the amplitude of the measured radio wave.

The influence of multipath such as ground reflection is reduced by performing the control of the power transmission radio wave and the wireless power transmission to the aerial moving body using the radio waves at a place having a good radio wave environment such as outdoors. For this reason, the wireless power transmission by the radio wave can be performed with higher accuracy than the conventional technique. Because the transmission of various data and commands uses the mobile communication system provided for controlling the drone, it is not necessary to add new hardware to the drone for the purpose of the communication necessary for performing the wireless power transmission. Consequently, the weight of the mounted device can be reduced, and the wireless power transmission to the drone can be performed with low power consumption.

Instead of the phased array antenna, the power may be transmitted to the aerial moving body using a wireless power transmission device including a power transmission antenna that changes the orientation direction mechanically. The direction in which the aerial moving body exists may be sent to the wireless power transmission device by means other than the pilot signal. Any wireless power transmission device can radiate the radio wave in the direction in which the aerial moving body exists with higher accuracy than the conventional technique and improve the efficiency of the wireless power transmission as long as the wireless power transmission device includes the power transmission antenna that can change the orientation direction in which the power is transmitted by the radiated radio wave, the radiation direction determiner that determines the radiation direction that is the direction in which the aerial moving body of the power transmission target exists, the orientation direction changer that directs the orientation direction of the power transmission antenna in the radiation direction, and a transmission signal generator that generates the transmission signal transmitted as the radio wave from the power transmission antenna. Sometimes arrival direction detection device 38 that is the radiation direction determiner is installed in the position apart from power transmission device 1A, such arrival direction detection device 38 is included in the wireless power transmission device.

By performing the REV method using the aerial moving body such as the drone, the REV method can be performed in a situation where the power is transmitted actually to the aerial moving body. For this reason, the REV method can accurately be performed, and the radio wave can accurately be radiated in the direction in which the aerial moving body exists when the power is transmitted to the aerial moving body. That is, the radio wave can be radiated in the direction in which the aerial moving body exists with higher accuracy than the conventional technique, and the efficiency of the wireless power transmission can be improved higher than the conventional technique.

When the wireless power transmission device is not used as the radio wave measurement system, measurement system control device 21A can be omitted. When measurement system control device 21A does not exist, power transmission control device 22A sends and receives the command to perform the REV method and the measured data of the received power through mobile command device 4A and mobile communication system 12. Flows of the command to perform the REV method and the measured data of the received power are not illustrated in FIG. 7.

When the REV method is performed, an antenna fixed to the ground may be used instead of the measurement antenna mounted on the drone. In this case, the drone does not have the function of performing the REV method. The drone may not include the measurement antenna, but the detector connected to the power reception antenna may measure the electric field strength of the radio wave received by the power reception antenna. That is, the power reception antenna may be used as the measurement antenna.

The above can be applied to other embodiments.

Third Embodiment

Figure 10:
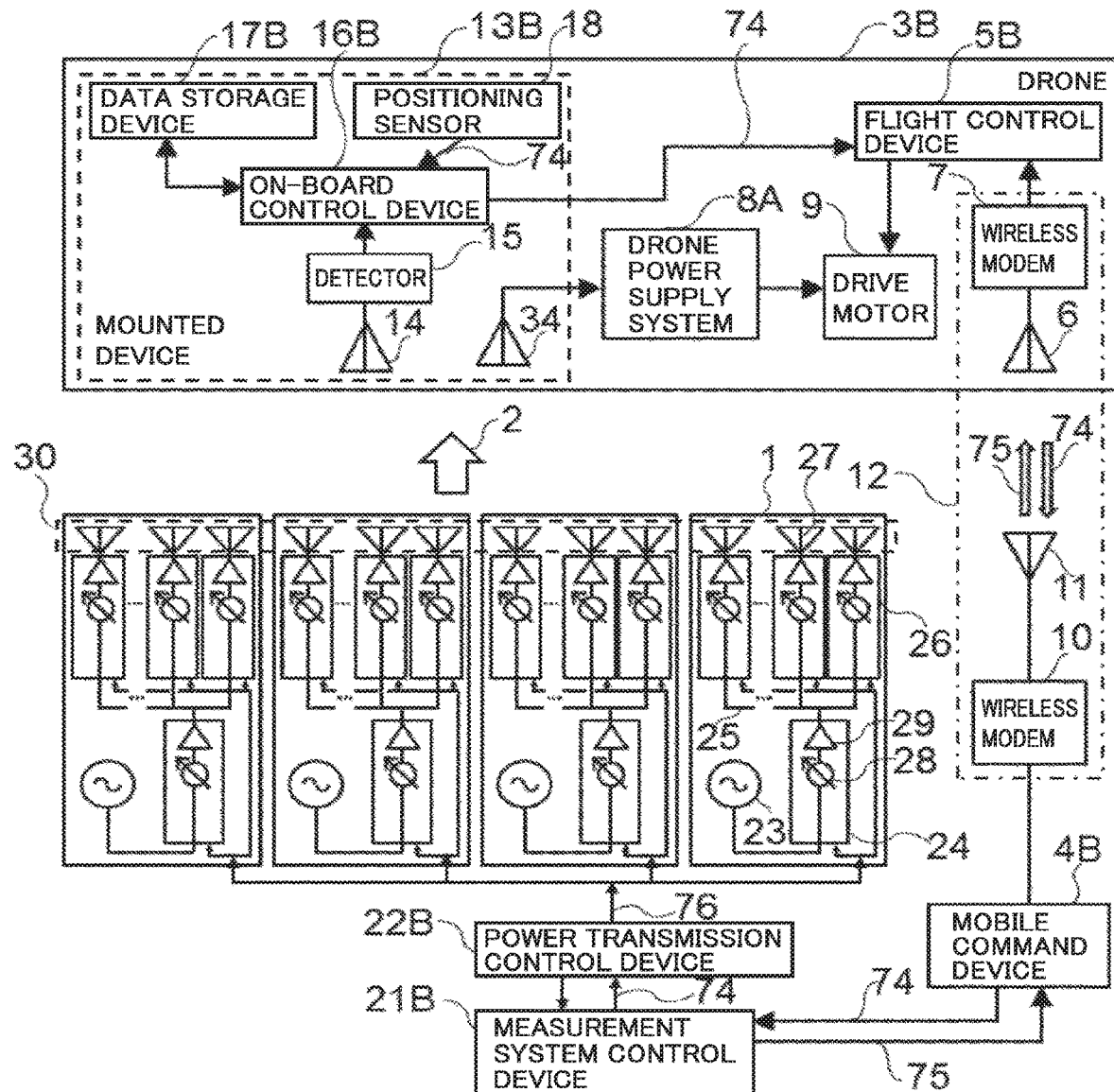
FIG. 10 is a configuration diagram illustrating a power transmission system to an aerial moving body by a wireless power transmission device according to a third embodiment of the present disclosure.

A third embodiment is the case that the second embodiment is changed such that the power transmission device transmits the power toward the aerial moving body by transmitting the position data of the aerial moving body to the power transmission device instead of the pilot signal. With reference to FIG. 10, a configuration of a power transmission system to an aerial moving body by a wireless power transmission device of the third embodiment of the present disclosure is described. FIG. 10 is a configuration diagram illustrating the power transmission system to the aerial moving body by the wireless power transmission device of the third embodiment of the present disclosure.

In FIG. 10, points different from FIG. 7 of the second embodiment are described. Power transmission device 1 is the same as that of the first embodiment. Power transmission device 1 does not include pilot reception antenna 37. Arrival direction detection device 38 does not exist. A drone 3B does not include pilot transmitter 31 and pilot transmission antenna 33. Drone 3B includes positioning sensor 18. Position data 74 measured by positioning sensor 18 is sent to a measurement system control device 21B through an on-board control device 16B, a flight control device 5B, mobile communication system 12, and mobile command device 44. Position data 74 is stored also in data storage device 17B. Positioning sensor 18 may be connected to a flight control device 5B. In this case, position data 74 is sent to power transmission control device 22B though flight control device 5B, mobile communication system 12, a mobile command device 4B, and measurement system control device 21B.

Positioning sensor 18 is a position measurer that measures a mobile position that is the position of drone 3B. Power transmission control device 22B is a radiation direction determiner that determines the direction from power transmission device 1 to the position of drone 3B as the radiation direction from position data 74. The determined radiation direction is stored as radiation direction data 81. Power transmission control device 22B determines phase and amplitude command values (power transmission control signal 76) for first-stage module 24 and second-stage module 26 such that the power can be transmitted in the radiation direction represented by radiation direction data 81. Power transmission control device 22B controls power transmission device 1 using power transmission control signal 76. A combination of at least a part of the power transmission control device and the power transmission device can be considered also as the wireless power transmission device.

Figure 11:
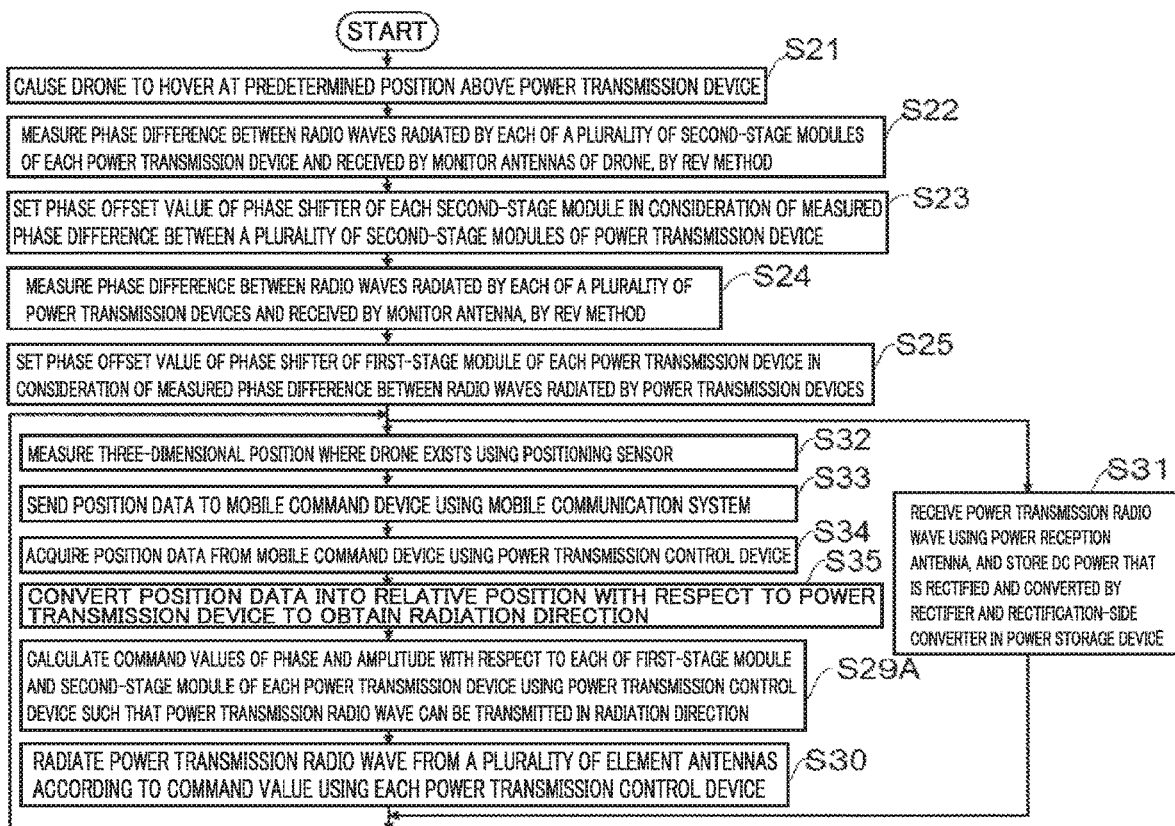
FIG. 11 is a flowchart illustrating a power transmission procedure in the power transmission system to the aerial moving body by the wireless power transmission device of the third embodiment.

The operation is described. FIG. 11 is a flowchart illustrating a power transmission procedure in the power transmission system to the aerial moving body by the wireless power transmission device of the third embodiment. In FIG. 11, points different from FIG. 9 of the second embodiment are described. Steps S26 to S28 are changed to steps S32 to S35. In step S32, positioning sensor 18 measures the three-dimensional position where drone 3B exists. In step S33, measured position data 74 is sent to mobile command device 4B by mobile communication system 12. In step S34, power transmission control device 22B acquires position data 74 from mobile command device 4B through measurement system control device 21B. In step S35, power transmission control device 22B converts position data 74 into a position relative to power transmission device 1, and obtains the radiation direction. In step S29A, power transmission control device 22B calculates power transmission control signal 76 instructing the phase and the amplitude for each of first-stage module 24 and second-stage module 26 of each power transmission device 1A. Power transmission control signal 76 is calculated such that power transmission device 1 can transmit power transmission radio wave 2 toward the radiation direction determined from the position of drone 3B relative to power transmission device 1.

Position data 74 of drone 3B is sent from drone 3B, and power transmission radio wave 2 is radiated in the direction in which drone 3B exists, the direction being obtained from position data 74. Consequently, power reception antenna 34 of drone 3B can receive power transmission radio wave 2 efficiently. In addition to the radiation of power transmission radio wave 2 in the direction in which drone 3B exists, power transmission control signal 76 may be generated such that the beam width of power transmission radio wave 2 is narrowed at the position where drone 3B exists.

The above can be applied to other embodiments.

Fourth Embodiment

Figure 12:
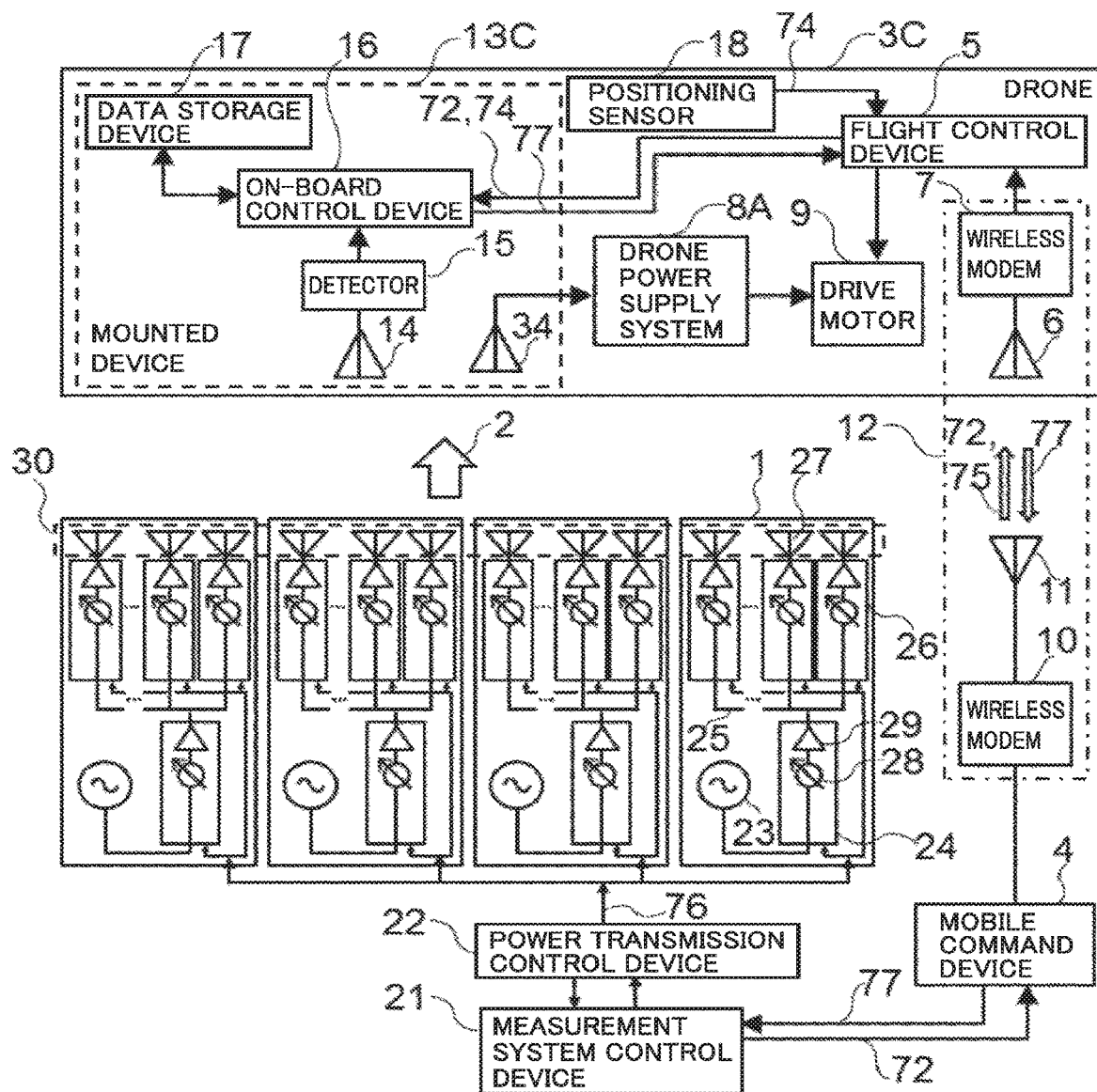
FIG. 12 is a configuration diagram illustrating a radio wave measurement system according to a fourth embodiment of the present disclosure using an aerial moving body and a power transmission system to the aerial moving body by a wireless power transmission device of the fourth embodiment.

A fourth embodiment is the case that the drone that is the aerial moving body measures the beam shape data of the power transmission radio wave radiated by the wireless power transmission device while being supplied with the power from the wireless power transmission device. Because the drone receives the supply of the power from the wireless power transmission device, a radio wave measurement system using an aerial moving body of the fourth embodiment is also the power transmission system to the aerial moving body by the wireless power transmission device. With reference to FIG. 12, a configuration of the radio wave measurement system using the aerial moving body of the fourth embodiment of the present disclosure and the power transmission system to the aerial moving body by the wireless power transmission device of the fourth embodiment is described. FIG. 12 is a configuration diagram illustrating the radio wave measurement system using the aerial moving body of the fourth embodiment of the present disclosure and the power transmission system to the aerial moving body by the wireless power transmission device of the fourth embodiment.

In FIG. 12, points different from FIG. 2 of the first embodiment are described. A drone 3C is obtained by changing drone 3 of the first embodiment so as to include power reception antenna 34 and drone power supply system 8A similar to those of the second embodiment. Power transmission device 1 is the same as that of the first embodiment.

Figure 13:
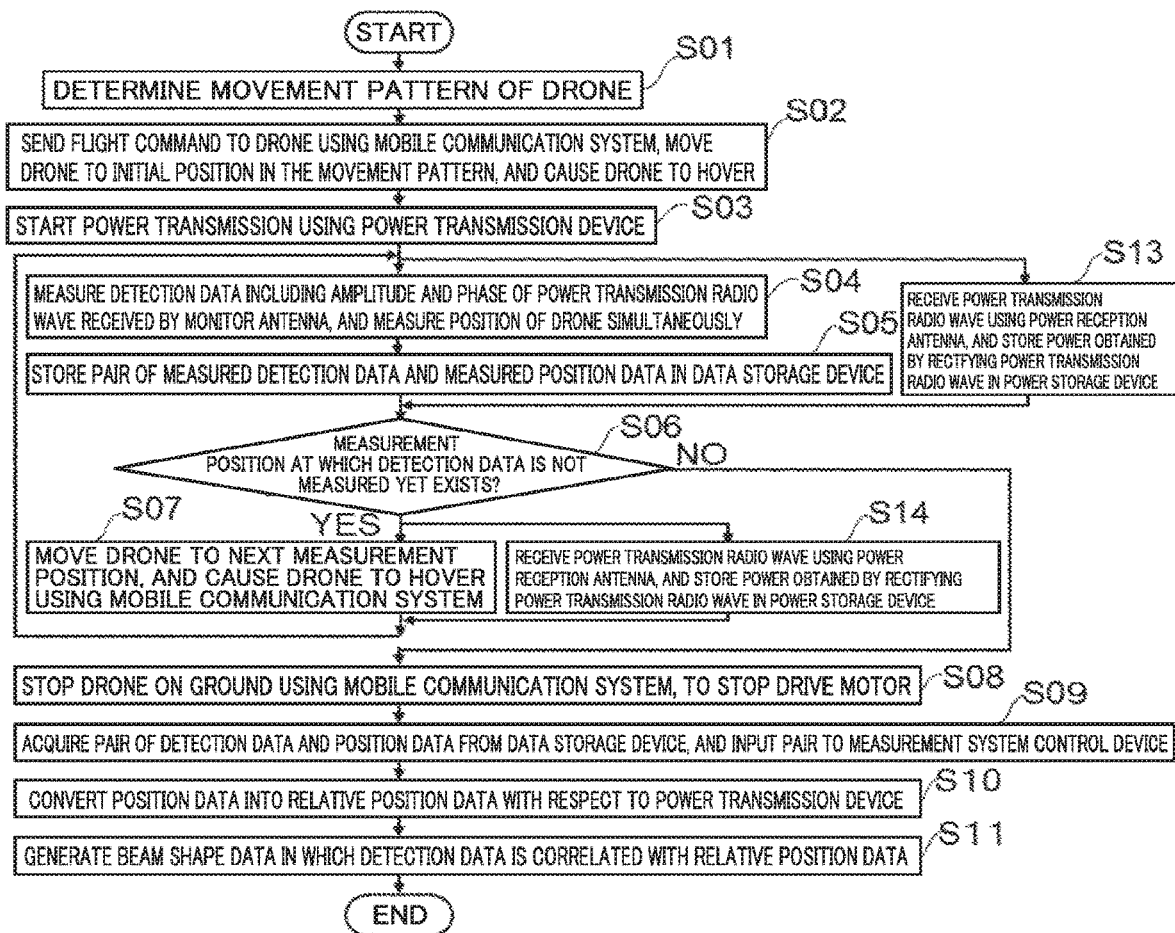
FIG. 13 is a flowchart illustrating a procedure for measuring the radiation pattern of the radio wave in the radio wave measurement system using the aerial moving body of the fourth embodiment and the power transmission system to the aerial moving body by the wireless power transmission device of the fourth embodiment.

The operation is described. FIG. 13 is a flowchart illustrating a procedure for measuring the radiation pattern of the radio wave in the radio wave measurement system using the aerial moving body of the fourth embodiment and the power transmission system to the aerial moving body by the wireless power transmission device of the fourth embodiment. In FIG. 13, points different from FIG. 4 of the first embodiment are described. In parallel to steps S04 to S07, in steps S13 and S14, power transmission radio wave 2 is received by power reception antenna 34, and the power obtained by rectifying received power transmission radio wave 2 using rectifier 35 is stored in power storage device 19. Step S13 operates in parallel to steps S04 and S05. Step S14 operates in parallel to step S07.

Because the beam shape of power transmission device 1 is measured, unlike the second embodiment and the like, power transmission control device 22A does not change the beam direction according to the position where drone 3C exists.

Drone 3C moves or hovers above power transmission device 1 while receiving the supply of the power by power transmission radio wave 2. For this reason, when the time necessary to measure beam shape 71 is longer than the case of the first embodiment, beam shape data 71 of power transmission radio wave 2 can be measured using drone 3C.

Fifth Embodiment

Figure 14:
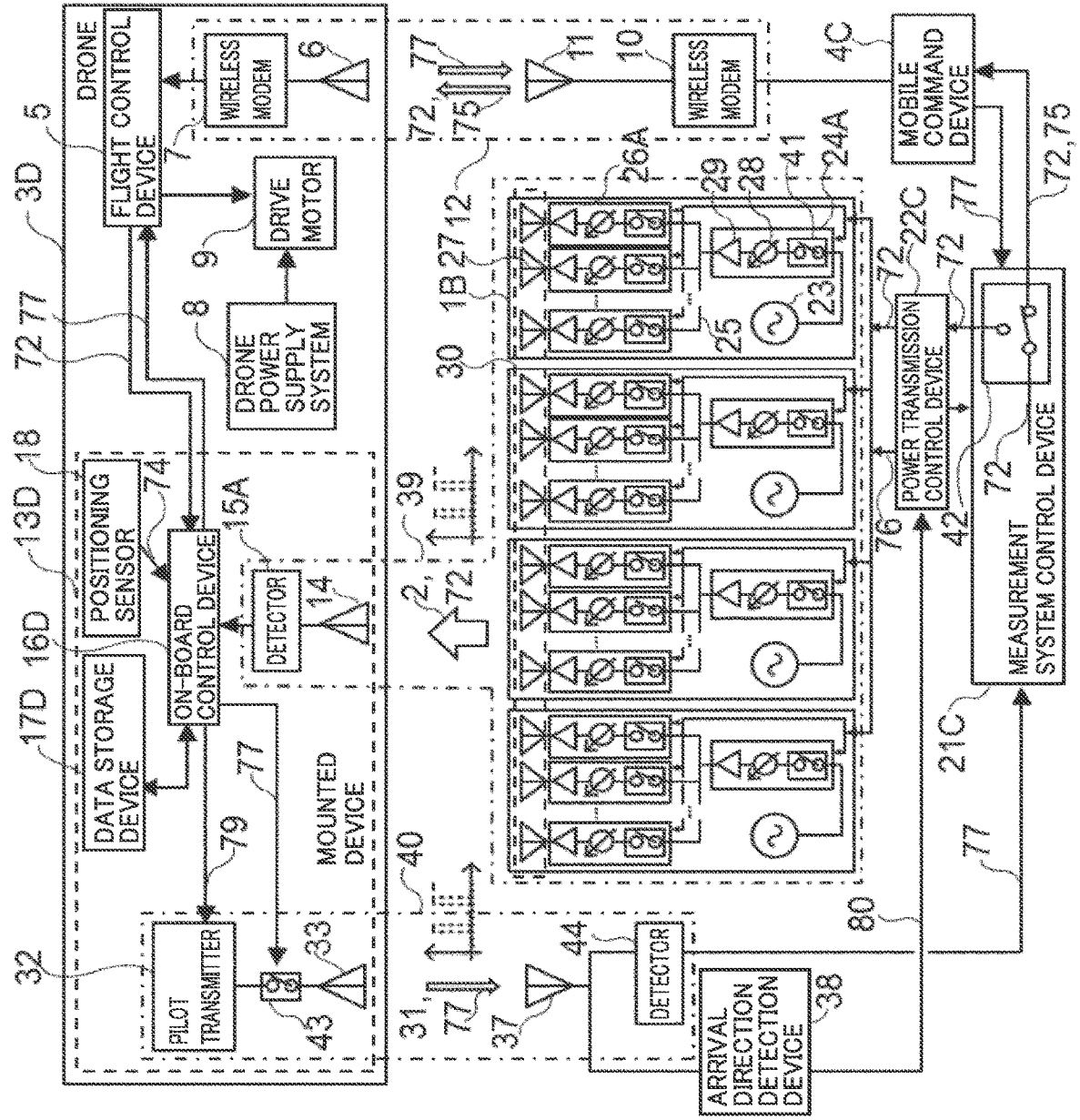
FIG. 14 is a configuration diagram illustrating a radio wave measurement system using an aerial moving body according to a fifth embodiment of the present disclosure.

A fifth embodiment is the case that the first embodiment is changed such that a communication system that communicates a measurement command and detection data for the radio wave measurement between the on-board control device and the measurement system control device is provided in addition to the mobile communication system. With reference to FIG. 14, a configuration of a radio wave measurement system using an aerial moving body according to the fifth embodiment of the present disclosure is described. FIG. 14 is a configuration diagram illustrating the radio wave measurement system using the aerial moving body of the fifth embodiment of the present disclosure. Instead of the first embodiment, the radio wave measurement system of the fourth embodiment or the radio wave measurement system having another configuration and the power transmission system to the aerial moving body may be changed.

A power transmission communication system 39 and a pilot communication system 40 are added in a drone 3D of the fifth embodiment. A measurement system control device 21C sends measurement command 72 to a mounted device 13D mounted on drone 3D, using power transmission communication system 39. Mounted device 13D sends detection data 73 to measurement system control device 21C, using pilot communication system 40. Positioning sensor 18 sends position data 74 to an on-board control device 16D. A data storage device 17D stores data indicating whether or not power transmission communication system 39 and pilot communication system 40 are used.

Power transmission communication system 39 includes a first-stage module 24A, a second-stage module 26A, element antenna 27 of a power transmission device 1B, and monitor antenna 14 and a detector 15A that are mounted on drone 3D. A pulse modulation switch 41 that switches radiation and non-radiation of a power transmission radio wave 2A according to a signal sequence of 0 or 1 representing measurement command 72 is added to first-stage module 24A and second-stage module 26A. That is, measurement command 72 is sent by pulse modulation of power transmission radio wave 2A using detection data 73. Detector 15A demodulates measurement command 72 from the reception or non-reception of received power transmission radio wave 2A. Measurement command 72 may be modulated and demodulated by not the pulse modulation but amplitude modulation or phase modulation such as BPSK (Binary Phase Shift Keying).

Measurement system control device 21C includes a communication system changeover switch 42. Communication system changeover switch 42 switches which one of a mobile command device 4C and a power transmission control device 22C measurement command 72 is sent to. That is, communication system changeover switch 42 switches which one of mobile communication system 12 and power transmission communication system 39 is used. A transmission destination of measurement command 72 may be switched by software.

Pilot communication system 40 includes a pilot transmitter 32, a pilot transmission antenna 33, a pulse modulation switch 43, a pilot reception antenna 37, and a detector 44. Pulse modulation switch 43 is provided between pilot transmitter 32 and pilot transmission antenna 33. Detector 44 detects pilot signal 31 received by pilot reception antenna 37. Pilot transmitter 32, pilot transmission antenna 33, and pulse modulation switch 43 are mounted on drone 3D. Pilot reception antenna 37 and detector 44 are installed on the ground.

Pulse modulation switch 43 switches between the radiation and the non-radiation of pilot signal 31 according to the signal sequence of 0 or 1 representing detection data 73 supplied from on-board control device 16D. That is, detection data 73 is sent by the pulse modulation of pilot signal 31 using detection data 73. Pilot signal 31 received by pilot reception antenna 37 is divided into two, and inputted to arrival direction detection device 38 and detector 44. Detector 44 demodulates detection data 73 from the reception or the non-reception of pilot signal 31. Detection data 73 may be modulated and demodulated by not the pulse modulation but the amplitude modulation or the phase modulation such as BPSK.

Using software, on-board control device 16D switches whether detection data 73 is sent to flight control device 5 or pulse modulation switch 43 is controlled by detection data 73. Consequently, which one of pilot communication system 40 and mobile communication system 12 sends detection data 73 is switched.

Figure 15:
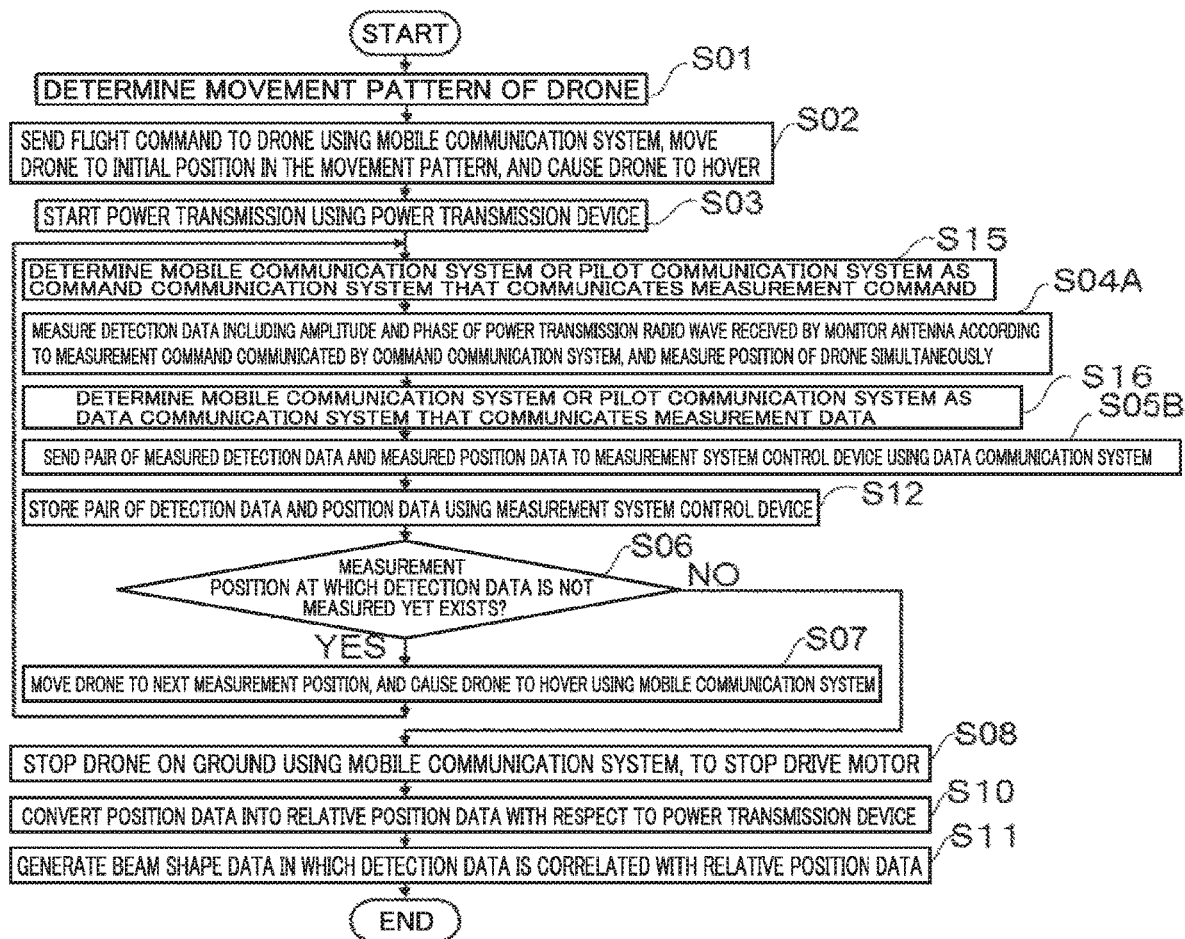
FIG. 15 is a flowchart illustrating a procedure for measuring the radiation pattern of the radio wave in the radio wave measurement system using the aerial moving body of the fifth embodiment.

The operation is described. FIG. 15 is a flowchart illustrating a procedure for measuring the radiation pattern of the radio wave in the radio wave measurement system using the aerial moving body of the fifth embodiment. In FIG. 15, points different from FIG. 5 of the first embodiment are described. At this point, a communication system that communicates measurement command 72 is referred to as a command communication system. A communication system that communicates measurement data 77 is referred to as a data communication system. Step S15 is added between steps S03 and S04A. In step S15, which one of mobile communication system 12 and power transmission communication system 39 is determined as the command communication system. In step S04A, detection data 73 including the amplitude and the phase of power transmission radio wave 2 received by monitor antenna 14 is measured according to measurement command 72 communicated by the command communication system determined in step S15. At the same time, the position of drone 3D is measured. Step S16 is added between steps S04A and S05B. In step S16, which one of mobile communication system 12 and pilot communication system 40 is determined as the data communication system. In step S05B, positioned detection data 70 is sent from on-board control device 16D to measurement system control device 21C through the data communication system determined in step S16.

The command communication system may be determined not every time measurement command 72 is communicated, but every several times. Flight command 75 may be communicated by power transmission communication system 39. Data communication system may be determined not every time measurement data 77 is communicated, but every several times. When communication with mobile communication system 12 is attempted but communication cannot be performed with mobile communication system 12, power transmission communication system 39 may be determined as the command communication system or pilot communication system 40 may be determined as the data communication system.

By providing power transmission communication system 39 and pilot communication system 40, the necessary data can be communicated at a necessary speed when a communication load on mobile communication system 12 is increased to slow the communication. Alternatively, power transmission communication system 39 and pilot communication system 40 can be used when mobile communication system 12 is out of order. Thus, power transmission communication system 39 and pilot communication system 40 contribute to stable operation of the radio wave measurement system greatly. The communication can be performed by the pulse modulation (on and off control of the transmission), the amplitude modulation, and the phase modulation of power transmission radio wave 2 and pilot signal 31 using a simple device. Consequently, the control of the power transmission radio wave and exchange of the data can be performed without adding large hardware and without increasing the load and the power consumption of mobile communication system 12.

Sixth Embodiment

Figure 16:
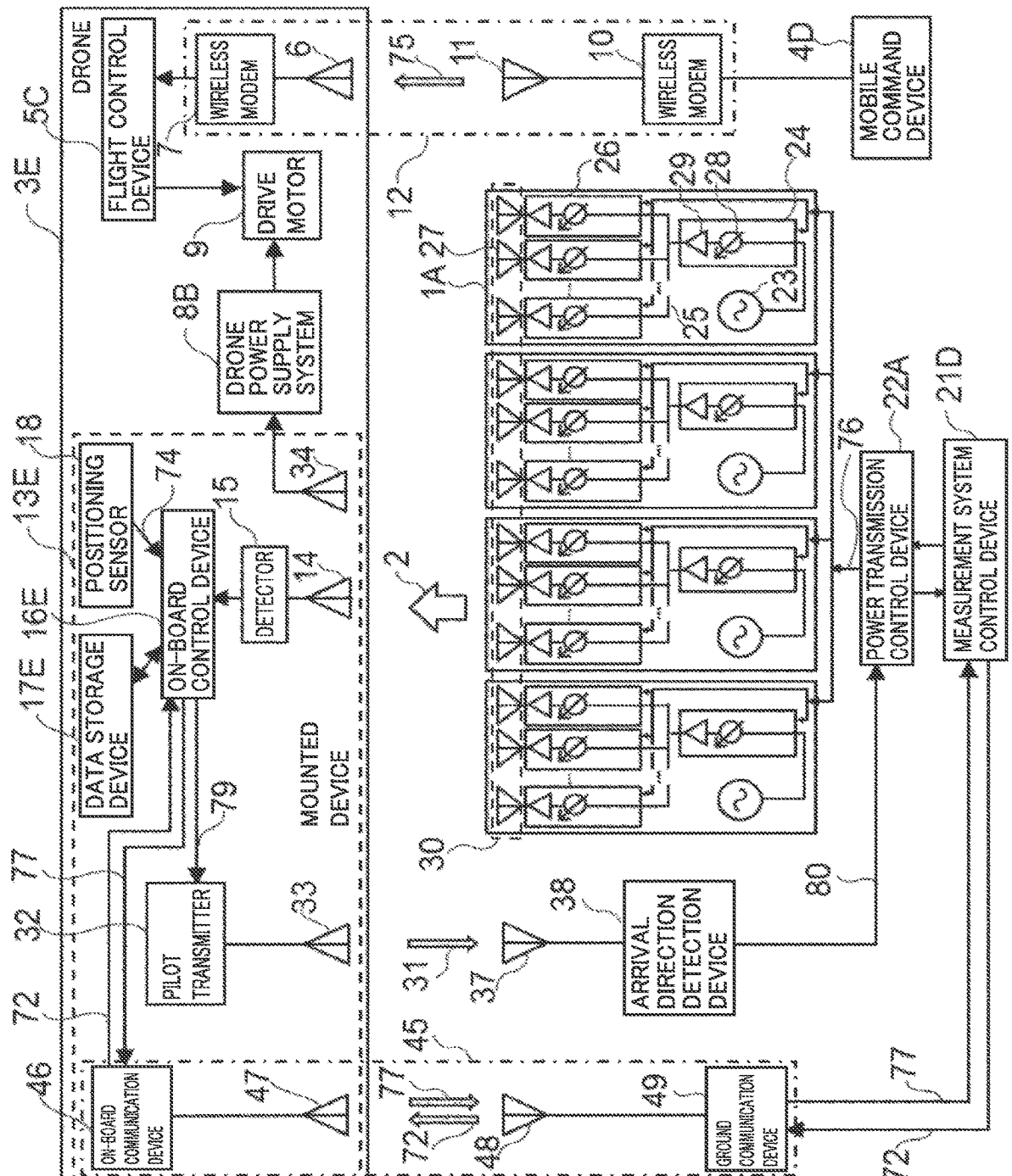
FIG. 16 is a configuration diagram of a radio wave measurement system using an aerial moving body according to a sixth embodiment of the present disclosure and a power transmission system to an aerial moving body by a wireless power transmission device of the sixth embodiment.

A sixth embodiment is the case that the second embodiment that is also the radio wave measurement system is changed such that a measurement communication system that communicates the measurement command and the detection data between the on-board control device and the measurement system control device is provided. In the sixth embodiment, the mobile communication system is not used in order to communicate the measurement command and the detection data between the on-board control device and the measurement system control device. The sixth embodiment is an embodiment of a radio wave measurement system using an aerial moving body and a power transmission system to an aerial moving body by a wireless power transmission device. With reference to FIG. 16, a configuration of the radio wave measurement system using the aerial moving body of the sixth embodiment and the power transmission system to the aerial moving body by the wireless power transmission device of the sixth embodiment is described. FIG. 16 is a configuration diagram illustrating the radio wave measurement system using the aerial moving body of the sixth embodiment and the power transmission system to the aerial moving body by the wireless power transmission device of the sixth embodiment of the present disclosure.

In the configuration of FIG. 16, a measurement communication system 45 is added to the configuration of the second embodiment in FIG. 7. Measurement communication system 45 includes an on-board communication device 46 and an on-board communication antenna 47 that are mounted on a drone 3E and a ground communication antenna 48 and a ground communication device 49 that are installed on the ground. Measurement command 72 from a measurement system control device 21D is sent to drone 3E by measurement communication system 45. Measurement data 77 measured by drone 3E is sent to measurement system control device 21D by measurement communication system 45. Measurement communication system 45 is a communication system other than mobile communication system 12. A data storage device 17E differs from data storage device 17A of the second embodiment in that data storage device 17E also stores data that is necessary for the radio wave measurement system, such as the measurement data 77.

The communication is not allowed between an on-board control device 16E and a flight control device 5C. Only a mounted device 13E is mounted on drone 3E, and no interface with the instrument included in drone 3E exists. Positioning sensor 18 is connected to on-board control device 16E such that position data 74 can be used in the power transmission system.

A mobile command device 4D sends flight command 75 using mobile communication system 12, and controls the flight of drone 3E.

Figure 17:
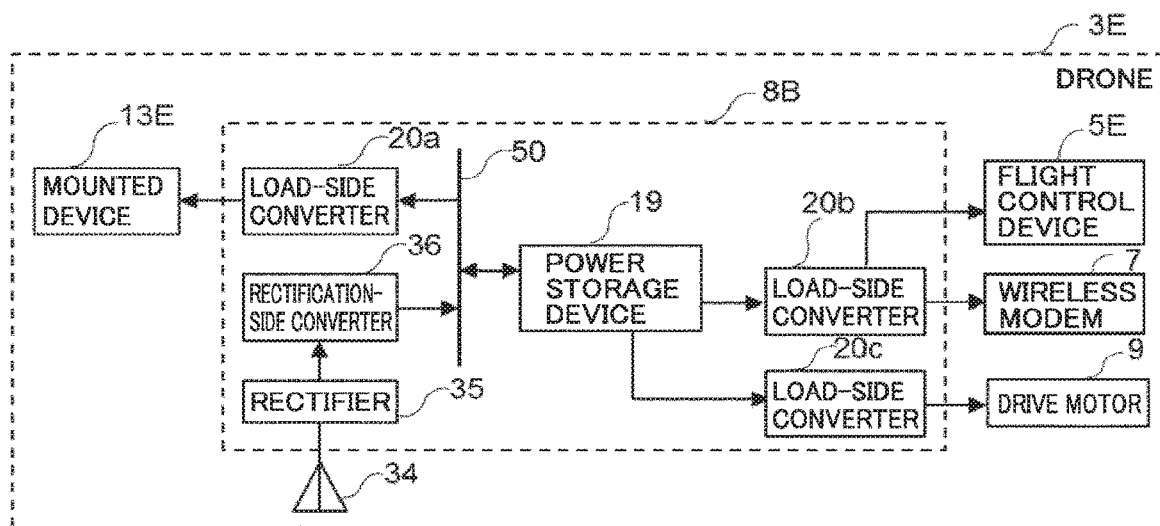
FIG. 17 is a block diagram illustrating a configuration of the radio wave measurement system using the aerial moving body of the sixth embodiment and a power supply system of the aerial moving body that receives power transmitted from the wireless power transmission device of the sixth embodiment.

With reference to FIG. 17, a drone power supply system 8B is described. FIG. 17 is a block diagram illustrating a configuration of the radio wave measurement system using the aerial moving body of the sixth embodiment and the power supply system of the aerial moving body that receives the power transmitted from the wireless power transmission device of the sixth embodiment. The difference between FIGS. 17 and 8 is that a measurement system power supply line 50 is added. Measurement system power supply line 50 is connected to power storage device 19 mounted on drone 3E. Rectification-side converter 36, load-side converter 20b, and load-side converter 20c are connected to power storage device 19 through measurement system power supply line 50. By providing measurement system power supply line 50, the connection point of the power supply system between drone 3E and mounted device 13E can be made only at one place of measurement system power supply line 50. The rectification-side converter may not be provided, and the configuration of the load-side converter may be changed.

The power transmission system to the aerial moving body of the sixth embodiment operates similarly to the second embodiment. The point different from power transmission system of the second embodiment is that the command and data that are used to perform the REV method are communicated using not mobile communication system 12 but measurement communication system 45. The sixth embodiment as the radio wave measurement system operates similarly to the radio wave measurement system of the first embodiment. The sixth embodiment differs from the first embodiment in that measurement communication system 45 is used.

Because transmission and reception of the data between the mounted device and the drone is not necessary, the radio wave measurement system can be constructed without modifying a commercially available drone. The mounted device can be mounted on another drone easily. That the mobile communication system is not used in order to communicate the command for radio wave measurement and the measured data can be applied to other embodiments.

Seventh Embodiment

Figure 18:
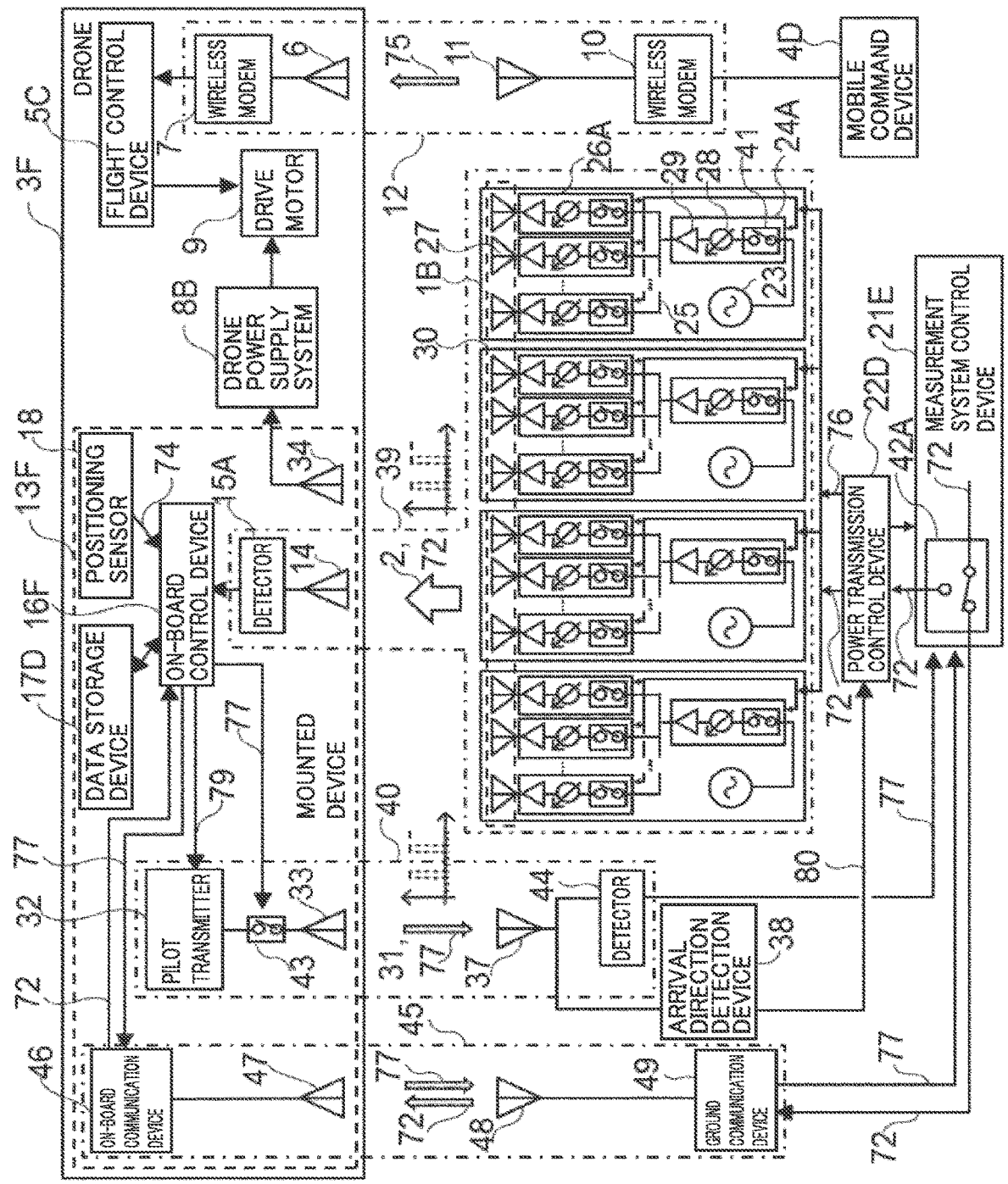
FIG. 18 is a configuration diagram illustrating a radio wave measurement system using an aerial moving body according to a seventh embodiment of the present disclosure and a power transmission system to the aerial moving body by a wireless power transmission device of the seventh embodiment.

A seventh embodiment is the case that the sixth embodiment is changed such that a power transmission communication system and a pilot communication system similar to the fifth embodiment are added. With reference to FIG. 18, a configuration of a radio wave measurement system using an aerial moving body of the seventh embodiment and a power transmission system to an aerial moving body by a wireless power transmission device of the seventh embodiment is described. FIG. 18 is a configuration diagram illustrating the radio wave measurement system using the aerial moving body of the seventh embodiment of the present disclosure and the power transmission system to the aerial moving body by the wireless power transmission device of the seventh embodiment.

The configuration in FIG. 18 is substantially similar to the configuration in FIG. 14 of the fifth embodiment. The configuration in FIG. 18 is different from the configuration in FIG. 14 in the following points. A communication system changeover switch 42A provided in a measurement system control device 21E switches which one of ground communication device 49 and a power transmission control device 22D sends measurement command 72. That is, communication system changeover switch 42A switches which one of measurement communication system 45 and power transmission communication system 39 is used. An on-board control device 16F switches by software whether detection data 73 is sent to on-board communication device 46 or pulse modulation switch 43 is controlled using detection data 73. Consequently, on-board control device 16F switches which one of measurement communication system 45 and pilot communication system 40 sends detection data 73.

The power transmission system to the aerial moving body of the seventh embodiment operates similarly to the second embodiment. The seventh embodiment differs from the second embodiment in that measurement communication system 45 is used instead of mobile communication system 12. The seventh embodiment as the radio wave measurement system operates similarly to the radio wave measurement system of the fifth embodiment. The seventh embodiment differs from the fifth embodiment in that measurement communication system 45 is used.

Because transmission and reception of the data between the mounted device and the drone is not necessary, the radio wave measurement system and/or the power transmission system to the aerial moving body can be constructed without modifying a commercially available drone. Power transmission communication system 39 and pilot communication system 40 can be used when measurement communication system 45 is out of order. Thus, power transmission communication system 39 and pilot communication system 40 contribute to stable operation of the radio wave measurement system and/or the power transmission system greatly.

The mobile communication system may be used for the communication between the on-board control device and the measurement system control device. In this case, because a triple communication system exists between the on-board control device and the measurement system control device, reliability of the communication system is further improved. The same applies to the sixth embodiment.

Eighth Embodiment

Figure 19:
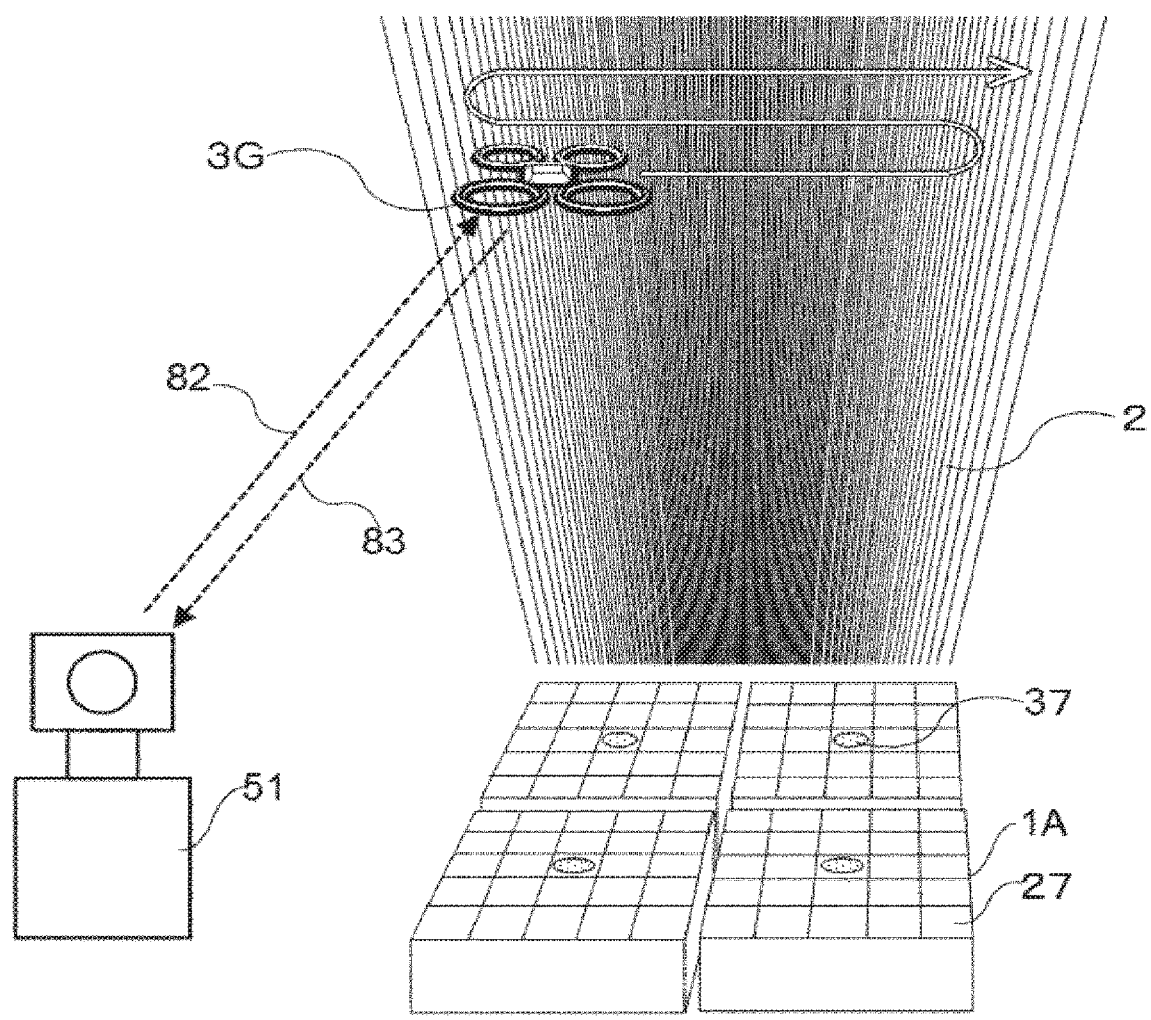
FIG. 19 is a conceptual diagram illustrating a radio wave measurement system using an aerial moving body according to an eighth embodiment of the present disclosure.
Figure 20:
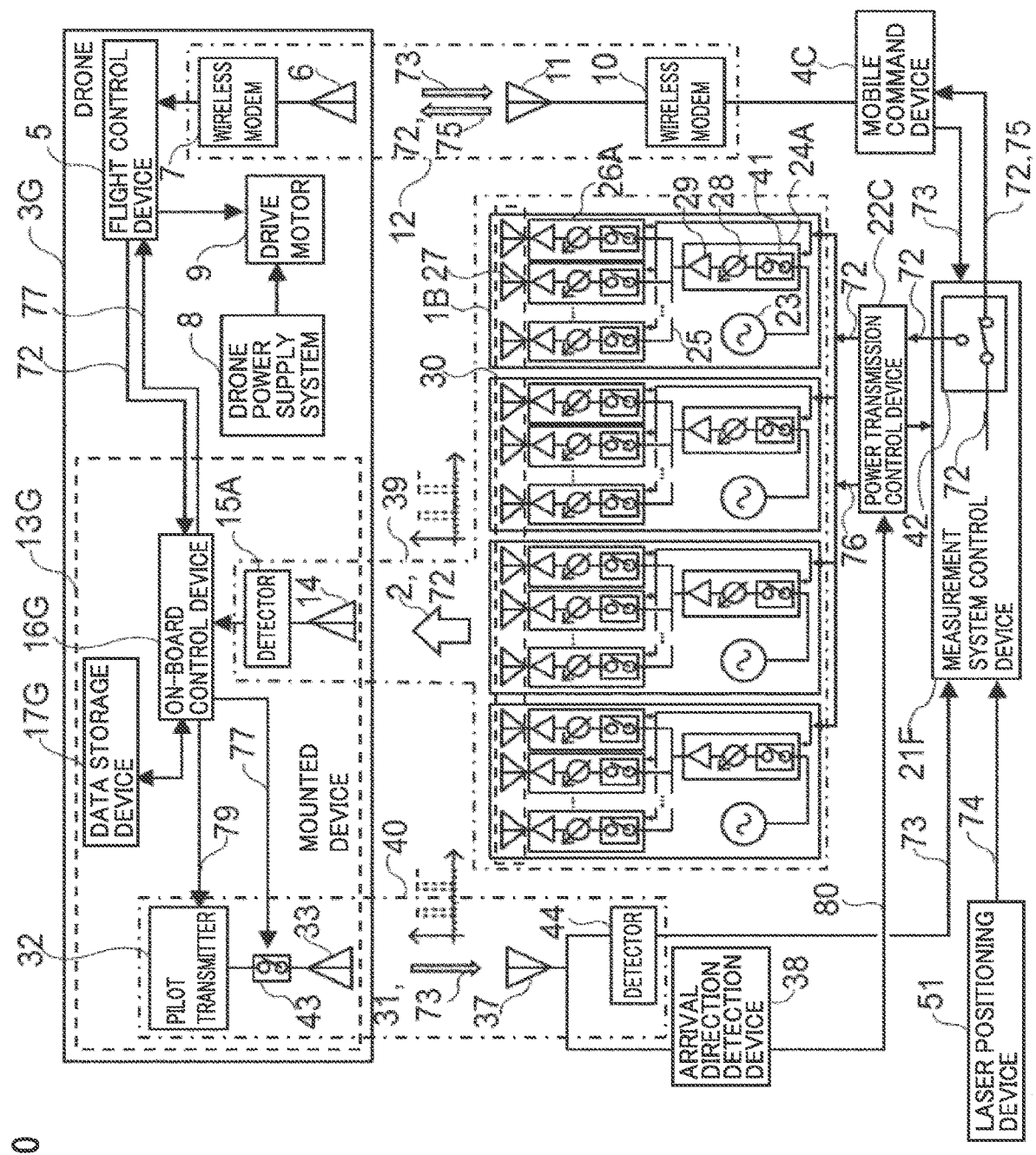
FIG. 20 is a block diagram illustrating the radio wave measurement system using the aerial moving body of the eighth embodiment.

An eighth embodiment is the case that the fifth embodiment is changed such that the position of the aerial moving body is measured by the positioning device installed on the ground. With reference to FIGS. 19 and 20, a configuration of a radio wave measurement system using an aerial moving body according to the eighth embodiment is described. FIG. 19 is a conceptual diagram illustrating the radio wave measurement system using the aerial moving body of the eighth embodiment of the present disclosure. FIG. 20 is a block diagram illustrating the radio wave measurement system using the aerial moving body of the eighth embodiment. Other embodiments can be changed such that the position of the aerial moving body is measured from the ground.

In FIG. 20, points different from FIG. 14 of the fifth embodiment are described. A drone 3G does not include positioning sensor 18. A laser positioning device 51 that measures the position of drone 3G is installed in the vicinity of power transmission device 1B. Position data 74 representing the position of drone 3G and measured by laser positioning device 51 is inputted to a measurement system control device 21F in a fixed period during the radio wave measurement. A data storage device 17G does not store position data 74, and stores the data indicating whether or not power transmission communication system 39 and pilot communication system 40 are used.

Laser positioning device 51 transmits a laser beam 82 in each direction, and receives a reflected laser beam 83 reflected by drone 3G that is the positioning target. The direction in which drone 3G exists is determined from the direction of reflected laser beam 83, and a distance to drone 3G is determined from the time until reflected laser beam 83 is received since laser beam 82 is radiated. The three-dimensional position of drone 3G is determined by converting the measured direction and distance. The radio wave may be used instead of the laser beam in the positioning device that measures the position of drone 3G.

Figure 21:
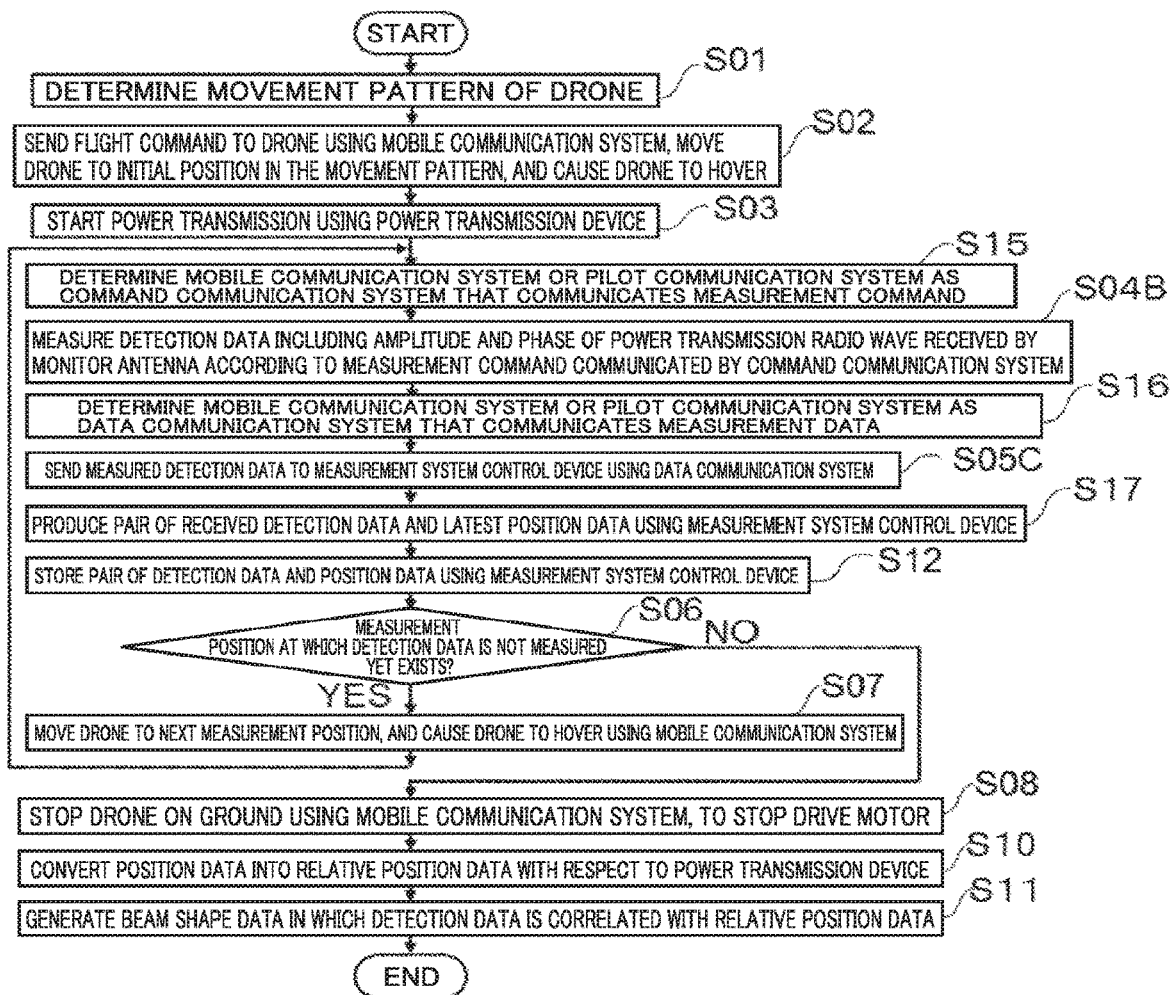
FIG. 21 is a flowchart illustrating a procedure for measuring the radiation pattern of the radio wave in the radio wave measurement system using the aerial moving body of the eighth embodiment.

The operation is described. With reference to FIG. 21, the operation of the radio wave measurement system is described. FIG. 21 is a flowchart illustrating a procedure for measuring the radiation pattern of the radio wave in the radio wave measurement system using the aerial moving body of the eighth embodiment.

In FIG. 21, points different from FIG. 15 of the fifth embodiment are described. In step S04B, drone 3G does not measure position data 74. In step S05C, measurement data 77 including measured detection data 73 is sent from an on-board control device 16G to flight control device 5, and sent to measurement system control device 21F through mobile communication system 12 and mobile command device 4C. In step S17, measurement system control device 21F combines detection data 73 included in received measurement data 77 and latest position data 74 to produce positioned detection data 70.

As in the fifth embodiment, in the radio wave measurement system, transmission radio wave 2 is radiated upward from power transmission device 1, and beam shape data 71 of power transmission radio wave 2 is measured above power transmission device 1 using drone 3G that is the aerial moving body. Consequently, beam shape data 71 of power transmission radio wave 2 of power transmission device 1 can accurately be measured while an influence of reflection is reduced.

Because drone 3G does not include the positioning sensor, drone 3G does not use the power in order to measure the own position. Because position data 74 is not sent from drone 3G, it is not necessary to consume the power required to send position data 74. Thus, drone 3G can fly for a longer time than the case of the fifth embodiment.

In the present disclosure, a free combination of the embodiments or a modification or omission of each embodiment can be made without departing from the scope of the present disclosure.

REFERENCE SIGNS LIST

- 1, 1A: power transmission device (wireless power transmission device)
- 2: power transmission radio wave (radio wave)
- 3, 3A, 3B, 3C, 3D, 3E, 3F, 3G: drone (aerial moving body)
- 4, 4A, 4B, 4C, 4D: mobile command device
- 5, 5A, 5B, 5C: flight control device
- 6: on-board communication antenna
- 7: wireless modem
- 8, 8A, 8B: drone power supply system
- 9: drive motor
- 10: wireless modem
- 11: communication antenna
- 12: mobile communication system
- 13, 13A, 13B, 13C, 13D, 13E, 13F, 13G: mounted device
- 14: monitor antenna (measurement antenna)
- 15, 15A: detector (radio wave measurer)
- 16, 16A, 16B, 16D, 16E, 16F, 16G: on-board control device
- 17, 17A, 17B, 17D, 17E, 17G: data storage device (storage device)
- 18: positioning sensor (position measurer)
- 19: power storage device
- 20a, 20b, 20c: load-side converter
- 21, 21D, 21E, 21F, 21G: measurement system control device (radiated radio wave data generator)
- 21A, 21B: measurement system control device
- 22: power transmission control device
- 22A, 22B, 22C, 22D: power transmission control device (radiation direction determiner, orientation direction changer)
- 23: transmission signal generator
- 24, 24A: first-stage module (element module)
- 25: distribution circuit
- 26, 26A: second-stage module (element module)
- 27: element antenna
- 28: phase shifter
- 29: amplifier
- 30: phased array antenna (measurement target antenna, power transmission antenna)
- 31: pilot signal
- 32: pilot transmitter (direction signal transmitter, direction signal transmission reception system)
- 33: pilot transmission antenna (direction signal transmitter, direction signal transmission reception system)
- 34: power reception antenna
- 35: rectifier
- 36: rectification-side converter
- 37: pilot reception antenna (direction signal receiver, direction signal transmission reception system)
- 38: arrival direction detection device (radiation direction determiner)
- 39: power transmission communication system
- 40: pilot communication system
- 41: pulse modulation switch
- 42, 42A: communication system changeover switch
- 43: pulse modulation switch
- 44: detector
- 45: measurement communication system
- 46: on-board communication device
- 47: on-board communication antenna
- 48: ground communication antenna
- 49: ground communication device
- 50: measurement system power supply line
- 51: laser positioning device
- 70, 70A: positioned detection data (radio wave measurement data)
- 71, 71A: beam shape data (radiated radio wave data)
- 72: measurement command
- 73: detection data (received radio wave data)
- 74: position data (measurement point data)
- 75: flight command
- 76: power transmission control signal
- 77: measurement data
- 78: relative position data (radio wave source relative position data)
- 79: pilot transmitter control command
- 80: arrival direction data
- 81: radiation direction data
- 82: laser beam
- 83: reflected laser beam

The invention claimed is:

1. A radio wave measurement system, comprising:
an aerial moving body to move or to hover above a measurement target antenna for radiating a radio wave in a sky direction;
a position measurer to measure a position of the aerial moving body;
a measurement antenna mounted on the aerial moving body and to receive the radio wave;
a radio wave measurer mounted on the aerial moving body and to measure received radio wave data including at least one of an amplitude and a phase of the radio wave received by the measurement antenna;
a radiated radio wave data generator to generate radiated radio wave data including the received radio wave data and radio wave source relative position data representing measurement point data as a position relative to the measurement target antenna, the measurement point data being data of a position of the aerial moving body at a point of time when the received radio wave data is measured;
a direction signal transmission reception system to transmit and receive a direction signal emitted by the aerial moving body to indicate an existence direction being a direction in which the aerial moving body exists when viewed from the measurement target antenna; and
a measurement system control device installed on a ground and including the radiated radio wave data generator,
wherein one of a mobile communication system for controlling the aerial moving body and the direction signal transmission reception system is selected to send the received radio wave data from the aerial moving body to the measurement system control device.

2. The radio wave measurement system according to claim 1, further comprising a power reception antenna mounted on the aerial moving body and to receive the radio wave, wherein
the measurement target antenna is a power transmission antenna to transmit power by the radiated radio wave, and
at least one of the aerial moving body and the radio wave measurer utilizes the power obtained from the radio wave received by the power reception antenna.

3. The radio wave measurement system according to claim 2, wherein the position measurer is installed on the ground.

4. The radio wave measurement system according to claim 1, wherein the position measurer is installed on the ground.

5. The radio wave measurement system according to claim 1, wherein a signal controlling the radio wave measurer is sent by the radio wave radiated by the measurement target antenna.

6. The radio wave measurement system according to claim 5, further comprising a power reception antenna mounted on the aerial moving body and to receive the radio wave, wherein
the measurement target antenna is a power transmission antenna to transmit power by the radiated radio wave, and
at least one of the aerial moving body and the radio wave measurer utilizes the power obtained from the radio wave received by the power reception antenna.

7. The radio wave measurement system according to claim 5, wherein the position measurer is installed on the ground.

8. A radio wave measurement system, comprising:
an aerial moving body to move or to hover above a measurement target antenna for radiating a radio wave in a sky direction;
a position measurer to measure a position of the aerial moving body;
a measurement antenna mounted on the aerial moving body and to receive the radio wave;
a radio wave measurer mounted on the aerial moving body and to measure received radio wave data including at least one of an amplitude and a phase of the radio wave received by the measurement antenna;
a radiated radio wave data generator to generate radiated radio wave data including the received radio wave data and radio wave source relative position data representing measurement point data as a position relative to the measurement target antenna, the measurement point data being data of a position of the aerial moving body at a point of time when the received radio wave data is measured;
a direction signal transmission reception system to transmit and receive a direction signal emitted by the aerial moving body to indicate an existence direction being a direction in which the aerial moving body exists when viewed from the measurement target antenna;
a measurement system control device installed on a ground and including the radiated radio wave data generator; and
a measurement communication system that is a communication system different from a mobile communication system for controlling the aerial moving body,
wherein one of the direction signal transmission reception system and the measurement communication system is selected to send the received radio wave data from the aerial moving body to the measurement system control device.

9. The radio wave measurement system according to claim 8, wherein a signal controlling the radio wave measurer is sent by the radio wave radiated by the measurement target antenna.

10. The radio wave measurement system according to claim 8, further comprising a power reception antenna mounted on the aerial moving body and to receive the radio wave, wherein
the measurement target antenna is a power transmission antenna to transmit power by the radiated radio wave, and
at least one of the aerial moving body and the radio wave measurer utilizes the power obtained from the radio wave received by the power reception antenna.

11. The radio wave measurement system according to claim 8, wherein the position measurer is installed on the ground.

12. A radio wave measurement system, comprising:
an aerial moving body to move or to hover above a measurement target antenna for radiating a radio wave in a sky direction;
a position measurer to measure a position of the aerial moving body;
a measurement antenna mounted on the aerial moving body and to receive the radio wave;
a radio wave measurer mounted on the aerial moving body and to measure received radio wave data including at least one of an amplitude and a phase of the radio wave received by the measurement antenna;
a radiated radio wave data generator to generate radiated radio wave data including the received radio wave data and radio wave source relative position data representing measurement point data as a position relative to the measurement target antenna, the measurement point data being data of a position of the aerial moving body at a point of time when the received radio wave data is measured;

a direction signal transmission reception system to transmit and receive a direction signal emitted by the aerial moving body to indicate an existence direction being a direction in which the aerial moving body exists when viewed from the measurement target antenna;

a measurement system control device installed on a ground and including the radiated radio wave data generator; and a measurement communication system that is a communication system different from a mobile communication system for controlling the aerial moving body, wherein one of the direction signal transmission reception system, the mobile communication system, and the measurement communication system is selected to send the received radio wave data from the aerial moving body to the measurement system control device.

13. The radio wave measurement system according to claim 12, wherein a signal controlling the radio wave measurer is sent by the radio wave radiated by the measurement target antenna.

14. The radio wave measurement system according to claim 12, further comprising a power reception antenna mounted on the aerial moving body and to receive the radio wave, wherein the measurement target antenna is a power transmission antenna to transmit power by the radiated radio wave, and at least one of the aerial moving body and the radio wave measurer utilizes the power obtained from the radio wave received by the power reception antenna.

15. The radio wave measurement system according to claim 12, wherein the position measurer is installed on the ground.

16. A radio wave measurement system, comprising:
an aerial moving body to move or to hover above a measurement target antenna for radiating a radio wave in a sky direction;
a position measurer to measure a position of the aerial moving body;
a measurement antenna mounted on the aerial moving body and to receive the radio wave;
a radio wave measurer mounted on the aerial moving body and to measure received radio wave data including at least one of an amplitude and a phase of the radio wave received by the measurement antenna; and
a radiated radio wave data generator to generate radiated radio wave data including the received radio wave data and radio wave source relative position data representing measurement point data as a position relative to the measurement target antenna, the measurement point data being data of a position of the aerial moving body at a point of time when the received radio wave data is measured,
wherein a signal controlling the radio wave measurer is sent by the radio wave radiated by the measurement target antenna.

17. The radio wave measurement system according to claim 16, further comprising a power reception antenna mounted on the aerial moving body and to receive the radio wave, wherein the measurement target antenna is a power transmission antenna to transmit power by the radiated radio wave, and at least one of the aerial moving body and the radio wave measurer utilizes the power obtained from the radio wave received by the power reception antenna.

18. The radio wave measurement system according to claim 16, wherein the position measurer is installed on the ground.

19. A radio wave measurement system, comprising:
an aerial moving body to move or to hover above a measurement target antenna for radiating a radio wave in a sky direction;
a position measurer to measure a position of the aerial moving body;
a measurement antenna mounted on the aerial moving body and to receive the radio wave;
a radio wave measurer mounted on the aerial moving body and to measure received radio wave data including at least one of an amplitude and a phase of the radio wave received by the measurement antenna;
a radiated radio wave data generator to generate radiated radio wave data including the received radio wave data and radio wave source relative position data representing measurement point data as a position relative to the measurement target antenna, the measurement point data being data of a position of the aerial moving body at a point of time when the received radio wave data is measured; and
a power reception antenna mounted on the aerial moving body and to receive the radio wave, wherein
the measurement target antenna is a power transmission antenna to transmit power by the radiated radio wave, and
at least one of the aerial moving body and the radio wave measurer utilizes the power obtained from the radio wave received by the power reception antenna.

20. A radio wave measurement system, comprising:
an aerial moving body to move or to hover above a measurement target antenna for radiating a radio wave in a sky direction, the measurement target antenna being an antenna in which a beam shape is measured;
a position measurer to measure a position of the aerial moving body;
a measurement antenna mounted on the aerial moving body and to receive the radio wave;
a radio wave measurer mounted on the aerial moving body and to measure received radio wave data including at least one of an amplitude and a phase of the radio wave received by the measurement antenna; and
a radiated radio wave data generator to generate radiated radio wave data representing the beam shape formed by the measurement target antenna and including the received radio wave data measured by the radio wave measurer and radio wave source relative position data representing measurement point data as a position relative to the measurement target antenna, the measurement point data being data of a position of the aerial moving body at a point of time when the received radio wave data is measured,
wherein the position measurer is installed on the ground.

* * * * *